United States Patent
Saito et al.

(10) Patent No.: US 7,271,219 B2
(45) Date of Patent: Sep. 18, 2007

(54) CURABLE RESIN, CURABLE RESIN MATERIAL, CURABLE FILM, AND INSULATOR

(75) Inventors: Takao Saito, Kyoto (JP); Shigeto Kon, Kyoto (JP); Munekazu Satake, Kyoto (JP); Masahito Inoue, Kyoto (JP)

(73) Assignee: Sanyo Chemical Industries, Ltd., Kyoto-shi (JP)

( * ) Notice: Subject to any disclaimer, the term of this patent is extended or adjusted under 35 U.S.C. 154(b) by 118 days.

(21) Appl. No.: 10/466,559

(22) PCT Filed: Aug. 28, 2001

(86) PCT No.: PCT/JP01/07373

§ 371 (c)(1),
(2), (4) Date: Jul. 25, 2003

(87) PCT Pub. No.: WO02/059176

PCT Pub. Date: Aug. 1, 2002

(65) Prior Publication Data

US 2004/0102601 A1    May 27, 2004

(30) Foreign Application Priority Data

Jan. 25, 2001  (JP)  ............... 2001-017684
Jan. 25, 2001  (JP)  ............... 2001-017688

(51) Int. Cl.
*C08L 23/04*  (2006.01)
*C08L 33/00*  (2006.01)
*C08L 35/00*  (2006.01)
*C08L 37/00*  (2006.01)
*C08L 41/00*  (2006.01)

(52) U.S. Cl. ............ 525/191; 525/206; 525/208; 525/217; 525/240; 525/241; 525/931

(58) Field of Classification Search ........... 525/191, 525/206, 208, 217, 240, 241, 931
See application file for complete search history.

(56) References Cited

U.S. PATENT DOCUMENTS

| | | | | |
|---|---|---|---|---|
| 3,950,284 A | * | 4/1976 | Fukuda et al. | 524/461 |
| 4,159,288 A | * | 6/1979 | Carson et al. | 525/228 |
| 4,873,116 A | * | 10/1989 | Ancker | 428/36.9 |
| 5,066,726 A | | 11/1991 | Modic | |
| H1064 H | * | 6/1992 | Wilkey | 525/314 |
| 5,496,873 A | * | 3/1996 | Bush et al. | 523/508 |
| 5,552,448 A | * | 9/1996 | Kobayashi et al. | 521/154 |
| 6,062,283 A | * | 5/2000 | Watanabe et al. | 152/510 |
| 6,287,696 B1 | * | 9/2001 | Noda et al. | 428/411.1 |
| 6,454,969 B1 | * | 9/2002 | Nishihara | 252/609 |

FOREIGN PATENT DOCUMENTS

JP   11-343310   12/1999

* cited by examiner

*Primary Examiner*—Nathan M. Nutter
(74) *Attorney, Agent, or Firm*—Oblon, Spivak, McClelland, Maier & Neustadt, P.C.

(57) ABSTRACT

The present invention uses a curable resin which has: in the molecule thereof, at least two crosslinking functional groups of at least one kind selected from the group consisting of epoxy group, (meth)acryloyl group, alkenylamino group and alkenyloxy group; a glass transition temperature before curing of 50 to 150° C.; a weight-average molecular weight of 10,000 to 1,000,000; and a dielectric constant of not higher than 3.5 after curing. By use of the curable resin of the above constitution, the present invention can provide a curable resin that an insulator having an excellent thermal shock resistance and an excellent dielectric property is obtained.

10 Claims, No Drawings

CURABLE RESIN, CURABLE RESIN MATERIAL, CURABLE FILM, AND INSULATOR

TECHNICAL FIELD

The present invention relates to a curable resin, a curable resin material, a curable film, and an insulator. More specifically, the present invention relates to a curable resin, a curable resin material, a curable film, and an insulator which are useful as overcoating materials and interlayer insulating materials for wiring boards used in various types of electric equipments, electronic parts, and semiconductor elements.

BACKGROUND ART

Various methods are known for improvement of humidity resistance and dielectric properties at a high frequency region in epoxy resin composition, polyimide resins and like resins, and for improvement of heat resistance and solvent resistance of polyolefin resins, polyphenylene ether resins and like as insulating materials: for example, curing by sulfur, organic peroxide, or crosslinking by electronic ray, radioactive ray of copolymers of ethylene and a norbornene type monomer (JP-A-62-34924); and use of a polyphenylene ether substituted by a propargyl or allyl group, a polyphenylene ether containing a double bond, and a polyphenylene ether modified by an unsaturated carboxylic acid or acid anhydride thereof (JP-A-1-69628, JP-A-1-69629, JP-A-1-113425, JP-A-1-113426, JP-A-1-239017, etc.).

However, in the former method, the dielectric constant is as high as 3.7 or more, and therefore the former method is not suitable for use as insulating materials such as overcoat materials and interlayer insulation materials.

On the other hand, in the latter examples, an allyl group, olefinic unsaturated group, or unsaturated carboxylic acid is used as a curable functional group, which results in insufficient heat resistance because of insufficient curing reactivity, especially in an oxygen atmosphere (in air).

The object of the present invention is to provide an insulator having excellent thermal shock resistance and excellent dielectric properties, and a suitable material therefor.

DISCLOSURE OF THE INVENTION

After comprehensive investigation to achieve the above object, the inventors of the present invention have completed the present invention.

A first aspect of the present invention is a curable resin which has: in the molecule thereof, at least two crosslinking functional groups of at least one kind selected from the group consisting of epoxy group, (meth)acryloyl group, alkenylamino group, and alkenyloxy group; a glass transition temperature before curing of 50 to 150° C.; a weight-average molecular weight of 10,000 to 1,000,000; and a dielectric constant after curing of not higher than 3.5. Preferably, the dielectric constant after curing is not higher than 3.2.

A second aspect of the present invention is a curable resin material comprising a curable resin composition (X) and a thermoplastic resin (Y), wherein a difference of solubility parameter between (X) and (Y) is 0.5 to 3.0, and (Y) has a weight-average molecular weight of 5,000 to 1,000,000.

A third aspect of the present invention is a curable resin material comprising a curable resin composition (X) and a thermoplastic resin (Y), wherein a difference of solubility parameter between (X) and (Y) is 1.0 to 3.0, and (X) has a solubility parameter of 5.0 to 12.0.

A fourth aspect of the present invention is a curable film comprising a composition which contains a curable polymer compound having a weight-average molecular weight of 10,000 to 1,000,000, in which the curable film has a tensile modulus of 100 to 250 kgf/mm$^2$ after curing and a dielectric constant of not higher than 3.5 after curing.

A fifth aspect of the present invention is an insulator having a tensile modulus of 100 to 250 kgf/mm$^2$, and a thermal expansion coefficient $\alpha 1$ of 30 to 50 ppm.

BEST MODE FOR CARRYING OUT THE INVENTION (1) First Aspect of Present Invention The crosslinking functional group is at least one selected from the group consisting of an epoxy group, (meth)acryloyl group, alkenylamino group and alkenyloxy group, or combination of two or more kinds of the groups.

The epoxy group may be any of the groups represented by Formula (1) or (2) below:

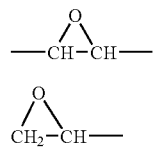

The (meth)acryloyl group means acryloyl group ($CH_2$=CHCO—) or methacryloyl group ($CH_2$=C($CH_3$)CO—).

The alkenylamino groups include alkenylamino groups of 2 to 4 carbon atoms such as a vinylamino, propenylamino (1-propenylamino), allylamino (2-propenyloxy), 1-butenylamino, 2-butenylamino and 1-methylpropenylamino groups.

The alkenyloxy groups include alkenyloxy groups of 2 to 4 carbon atoms such as a vinyloxy, propenyloxy (1-propenyloxy), allyloxy (2-propenyloxy), 1-butenyloxy, 2-butenyloxy and 1-methylpropenyloxy groups.

Of the above crosslinking functional groups, preferable are epoxy, (meth)acryloyl, vinyloxy, propenyloxy and allyloxy groups; more preferable are epoxy, (meth)acryloyl and propenyloxy groups; still more preferable are epoxy, and (meth)acryloyl; still more preferable are epoxy groups; particularly preferable is the epoxy group represented by the Formula (2).

Such crosslinking functional groups can give insulators having excellent thermal shock resistance and an excellent dielectric constant.

The number of the crosslinking functional groups mentioned above should be at least two; preferably 2 to 5,000 groups, more preferably 3 to 3,000, still more preferably 5 to 1,000, still more preferably 7 to 500, most preferably 10 to 400. Within such a range of the number of the crosslinking functional groups, the obtained insulator can readily have excellent thermal shock resistance and excellent dielectric constant.

The glass transition temperature of the curable resin (A) before curing should be in the range of 50 to 150° C., preferably 53 to 140° C., more preferably 56 to 130° C., still more preferably 59 to 135° C., still more preferably 62 to 120° C., most preferably 65 to 100° C. Within such a range of the glass transition temperature, the obtained insulator can readily have excellent thermal shock resistance and other excellent properties.

The glass transition temperature is measured by TMA-Tg.

The weight-average molecular weight of the curable resin (A) is 10,000 to 1,000,000, preferably 20,000 to 900,000, more preferably 30,000 to 500,000, still more preferably 40,000 to 200,000, still more preferably 50,000 to 150,000, most preferably 60,000 to 120,000. Within such a range of the weight-average molecular weight, the obtained insulator can readily have excellent thermal shock resistance and other excellent properties.

The weight-average molecular weight is measured by gel permeation chromatography, and is hereafter referred to as "Mw".

The dielectric constant of the curable resin (A) after curing is not higher than 3.5, preferably 2.4 to 3.2, more preferably 2.5 to 3.1, still more preferably 2.5 to 3.0, still more preferably 2.6 to 2.9, most preferably 2.6 to 2.8. Within such a range of the dielectric constant of the resin after curing, the resulting resin has higher reliability for use as the insulator, and can facilitate, in application to an integrated circuit of electronic parts or the like, improvement of a circuit performance with less delay of signals.

The curing is conducted by heating at 170±10° C. for 90±10 minutes in a following hot-air heater.

The dielectric constant is measured at 1 GHz according to JIS K6911 (1955) 5.14.

The curable resin (A) can readily be produced, for example, by ① (co)polymerization of a monomer having the crosslinking functional group, or ② conversion of a resin having a reactive functional group (an amino, nitrile, carboxyl, hydroxyl, isocyanato group, or the like) by reaction with a monomer having a crosslinking functional group into a crosslinking group-containing resin.

The reactive functional group-containing resin can be readily produced by (co)polymerization of a monomer (monomers) having a reactive functional group.

The useful crosslinking functional group-containing monomer includes monomers (a–j,v,w) having at least two functional groups of at least one kind selected from epoxy, (meth)acryloyl, alkenylamino, and alkenyloxy groups, and monomers (q–w) having at least one of the above-mentioned crosslinking functional groups and at least one of primary-amino, secondary-amino, nitrile, carboxyl, hydroxyl, and isocyanato groups.

Other than the above-mentioned monomers (q–w), the reactive functional group-containing monomer includes monomers (k–p) having at least two of at least one kind of functional group selected from primary-amino, secondary-amino, nitrile, carboxyl, hydroxyl, and isocyanato groups.

The useful monomers (a–j,v,w) having at least two functional groups of at least one kind selected from the group of epoxy, (meth)acryloyl and alkenyloxy groups include monomers (a) having only epoxy groups, monomers (b) having only (meth)acryloyl groups, monomers (c) having only vinyloxy groups, monomers (d) having only allyloxy groups, monomers (e) having only 2-propenyloxy groups, monomers (f) having an epoxy group and a (meth)acryloyl group, monomers (g) having an epoxy group and a vinyl group, monomers (h) having a (meth)acryloyl group and a vinyloxy group, monomers (i) having a (meth)acryloyl group and an allyloxy group, monomers (j) having a (meth) acryloyl group and a propenyloxy group, monomers (v) having allylamino groups, and monomers (w) having propenylamino groups.

The useful monomers (k–p) having at least two of at least one kind of functional group selected from primary-amino, secondary-amino, nitrile, carboxyl, hydroxyl, and isocyanato groups include monomers (k) having primary-amino groups, monomers (m) having secondary amino groups, monomers (n) having only carboxyl groups, monomers (O) having only hydroxyl groups, and monomers (p) having isocyanato groups.

The useful monomers (q–w) having at least one of the above-mentioned crosslinking functional groups and at least one of primary-amino, secondary-amino, nitrile, carboxyl, hydroxyl, and isocyanato groups include monomers (q) having a nitrile group and a vinyloxy group, monomers (r) having a nitrile group and a (meth)acryloyl group, monomers (s) having a hydroxyl group and a (meth)acryloyl group, monomers (t) having a (meth)acryloyl group and an isocyanato group, monomers (u) having a (meth)acryloyl group and a carboxyl group, monomers (v) having allylamino groups, and monomers (w) having propenylamino groups.

As the monomers (a) having only epoxy groups, useful are polyepoxides having 2 to 7 or more epoxy groups in the molecule and the like, including glycidyl ether type polyepoxides (a1), glycidyl ester type polyepoxides (a2), glycidylamine type polyepoxides (a3), alicyclic polyepoxides (a4), etc.

The glycidyl ether type polyepoxides (a1) include the compounds (a11) to (a14) below.

(a11) Diglycidyl ethers of a dihydric phenol (6 to 30 carbon atoms), including bisphenol F diglycidyl ether, bisphenol A diglycidyl ether, bisphenol B diglycidyl ether, bisphenol AD diglycidyl ether, bisphenol S diglycidyl ether, halogenated bisphenol A diglycidyl ether, tetrachlorobisphenol A diglycidyl ether, catechin diglycidyl ether, resorcinol diglycidyl ether, hydroquinone diglycidyl ether, 1,5-dihydroxynaphthalene diglycidyl ether, dihydroxybiphenyl diglycidyl ether, octachloro-4,4'-dihydroxybiphenyl diglycidyl ether, tetramethylbiphenyl diglycidyl ether, 9,9'-bis(4-hydroxyphenyl)fluorene diglycidyl ether, diglycidyl ether formed from 2 moles of bisphenol A and 3 moles of epichlorohydrin, etc.

(a12): Polyglycidyl ethers of polyhydric phenol (6 to 50 or more carbon atoms, Mw 110 to 5,000, 3 to 6 hydric or higher), including pyrogallol triglycidyl ether, dihydroxynaphthylcresol triglycidyl ether, tris(hydroxyphenyl)methane triglycidyl ether, dinaphthyltriol triglycidyl ether, tetrakis(4-hydroxyphenyl)ethane tetraglycidyl ether, trismethyltert-butyl-butylhydroxymethane triglycidyl ether, 4,4'-oxybis(1,4-phenylethyl)tetracresol-glycidyl ether, 4,4'-oxybis(1,4-phenylethyl)phenyl glycidyl ether, bis(dihydroxynaphthalene) tetraglycidyl ether, etc.

(a13) Diglycidyl ethers of dihydric alcohols [adducts of 1 to 90 moles of an alkylene oxide (2 to 4 carbon atoms) with an alkylene glycol of 2 to 6 or more carbon atoms, or with a dihydric phenol of 6 to 24 or more carbon atoms] (hereinafter the alkylene oxide of 2 to 4 carbon atoms being referred to as "AO"), including ethylene glycol diglycidyl ether, propylene glycol diglycidyl ether, tetramethylene glycol diglycidyl ether, 1,6-hexanediol diglycidyl ether, polyethylene glycol (Mw 150 to 4,000) diglycidyl ether, polypropylene glycol (Mw 180 to 5,000) diglycidyl ether, polytetramethylene glycol (Mw 200 to 5,000) diglycidyl ether, neopentyl glycol diglycidyl ether, diglycidyl ethers of adducts of ethylene oxide and/or propylene oxide (1 to 20 moles) with bisphenol A (hereinafter ethylene oxide being referred to as "EO", and propylene oxide being referred to as "PO"), etc.

(a14) Polyglycidyl ethers of 3 to 7 hydric or higher polyhydric alcohols (3 to 50 or more carbon atoms, and Mw 76 to 10,000), including trimethylolpropane triglycidyl ether, glycerin triglycidyl ether, pentaerythritol tetraglycidyl ether, sorbitol hexaglycidyl ether, polyglycerin (polymerization degree: 2 to 5) polyglycidyl ether, etc.

The glycidyl ester type polyepoxides (a2) include the compounds (a21) to (a22) below.

(a21) Polyglycidyl esters of divalent to hexavalent or higher aromatic polycarboxylic acid (6 to 20 or more carbon atoms), including diglycidyl phthalate, diglycidyl isophthalate, diglycidyl terephthalate, triglycidyl trimellitate, etc.

(a22) Polyglycidyl esters of divalent to hexavalent or higher aliphatic or alicyclic polycarboxylic acid (6 to 20 or more carbon atoms), including hydrogenated products of compounds (a21) hydrogenated at the aromatic nucleus, diglycidyl esters of a dimer acid, diglycidyl oxalate, diglycidyl maleate, diglycidyl succinate, diglycidyl glutarate, diglycidyl adipate, diglycidyl pimelate, triglycidyl tricarballylate, etc.

The glycidylamine type polyepoxides (a3) include the compounds (a31)~(a34) below.

(a31) Polyglycidyl aromatic amine having 2 to 10 or more glycidyl groups (the aromatic amine having 6 to 20 or more carbon atoms), including N,N-diglycidyl-aniline, N,N-diglycidyl-toluidine, N,N,N',N'-tetraglycidyl-diaminodiphenylmethane, N,N,N',N-tetraglycidyl-diaminodiphenyl sulfone, N,N,N',N-tetraglycidyl-diethyldiphenylmethane, N,N,O-triglycidylaminophenol, etc.

(a32) Polyglycidyl aliphatic or aromatic amines having 2 to 10 or more glycidyl groups (the aliphatic or aromatic amine having 6 to 20 or more carbon atoms), including N,N,N',N'-tetraglycidyl-xylylenediamine, N,N,N', N'tetraglycidyl-hexamethylenediamine, etc.

(a33) Polyglycidyl alicyclic amines having 2 to 10 or more glycidyl groups (the alicyclic amine having 6 to 20 or more carbon atoms), including hydrogenated N,N,N',N'-tetraglycidyl-xylylenediamine, etc.

(a34) Polyglycidyl heterocyclic amines having 2 to 10 or more glycidyl groups (the heterocyclic amine having 6 to 20 or more carbon atoms), including trisglycidylmelamine, N-glycidyl-4-glycidyloxyprrolidone, etc.

The alicyclic polyepoxides (a4) include alicyclic epoxides having 6 to 50 or more carbon atoms, Mw of 98 to 5,000, and having 2 to 4 or more epoxy groups, including vinylcyclohexene dioxide, limonene dioxide, dicyclopentadiene dioxide, bis(2,3-epoxycyclopentyl) ether, ethylene glycol bisepoxydicyclopentyl ether, 3,4-epoxy-6-methylcyclohexylmethyl-3',4'-epoxy-6'methylcyclohexanecarboxylate, bis(3,4-epoxy-6-methylcyclohexylmethyl)butylamine, etc.

As the monomers (b) having only (meth)acryloyl groups, useful are (b1) di(meth)acrylates of dihydric phenols (6 to 30 carbon atoms), (b2) poly(meth)acrylates of polyhydric phenols {6 to 50 or more carbon atoms, Mw 110 to 5,000, 3 to 6 hydric or higher}, (b3) di(meth)acrylates of dihydric alcohols [alkylene glycols of 2 to 6 or more carbon atoms, or 1 to 90 mole-AO adducts of dihydric phenols of 6 to 24 or more carbon atoms, and (b4) poly(meth)acrylates of 3 to 7 hydric or higher polyhydric alcohols (3 to 50 or more carbon atoms, Mw 76 to 10,000).

The (meth)acrylates (b1) of a dihydric phenol include bisphenol F di(meth)acrylate, bisphenol A di(meth)acrylate, bisphenol B di(meth)acrylate, bisphenol AD di(meth)acrylate, bisphenol S di(meth)acrylate, halogenated bisphenol A di(meth)acrylates (e.g., tetrachlorobisphenol A di(meth) acrylate, etc.), catechin di(meth)acrylate, resorcinol di(meth)acrylate, hydroquinone di(meth)acrylate, 1,5-dihydroxynaphthalene di(meth)acrylate, dihydroxybiphenyl di(meth)acrylate, octachloro-4,4'-dihydroxybiphenyl di(meth)acrylate, tetramethylbiphenyl di(meth)acrylate, 9,9'-bis(4-hydroxyphenyl)fluorene di(meth)acrylate, etc.

The poly(meth)acrylates (b2) of a polyhydric phenol include pyrogallol tri(meth)acrylate, dihydroxynaphthylcresol tri(meth)acrylate, tris(hydroxyphenyl)methane tri (meth)acrylate, dinaphthyltriol tri(meth)acrylate, tetrakis(4-hydroxyphenyl)ethane tetra(meth)acrylate, tris-methyl-tert-butyl-butylhydroxymethane tri(meth)acrylate, 4,4'-oxybis (1,4-phenylethyl)tetracresol (meth)acrylate, 4,4'-oxybis(1,4-phenylethyl)phenyl(meth)acrylate, bis (dihydroxynaphthalene) tetra(meth)acrylate, etc.

The methacrylates (b3) of a dihydric alcohol include ethylene glycol di(meth)acrylate, propylene glycol di(meth) acrylate, tetramethylene glycol di(meth)acrylate, 1,6-hexanediol di(meth)acrylate, polyethylene glycol (Mw 150 to 4,000) di(meth)acrylate, polypropylene glycol (Mw 180 to 5,000) di(meth)acrylate, polytetramethylene glycol (Mw 200 to 5,000) di(meth)acrylate, neopentylglycol di(meth) acrylate, di(meth)acrylates of adducts of EO and/or PO (1 to 20 moles) of bisphenol A.

The poly(meth)acrylates (b4) of a 3 to 7 hydric or higher polyhydric alcohol include trimethylolpropane tri(meth) acrylate, glycerin tri(meth)acrylate, pentaerythritol tetra (meth)acrylate, sorbitol hexa(meth)acrylate, and poly(meth) acrylates of polyglycerin (polymerization degree: 2 to 5), etc.

As the monomers (c) having only vinyloxy groups, useful are hydrocarbon compounds of 4 to 20 carbon atoms, such as divinyl ether, divinyloxybenzene, divinyloxytoluene, divinyloxyxylene, trivinyloxybenzene, 1,2-divinyloxyethane, etc. Further, divinyl sulfide, divinyl sulfone, divinyl sulfoxide, etc. are also useful therefor.

As the monomers (d) having only allyloxy groups, useful are diallyl ethers (d1) of a dihydric phenol (6 to 30 carbon atoms), polyallyl ethers (d2) of a polyhydric phenol {6 to 50 or more carbon atoms, Mw 110 to 5,000, 3 to 6 hydric or higher}, diallyl ethers (d3) of a dihydric alcohol (alkylene glycols of 2 to 6 or more carbon atoms or dihydric phenol of 1 to 90 mole-AO adducts of dihydric phenols), polyallyl ethers (d4) of a 3 to 7 hydric or higher polyhydric alcohol (3 to 50 or more carbon atoms, Mw 76 to 10,000), polyallyl esters (d5) of a divalent to hexavalent or higher aromatic polycarboxylic acid (6 to 20 or more carbon atoms), polyallyl esters (d6) of a divalent to hexavalent or higher aliphatic or alicyclic polycarboxylic acid (6 to 20 or more carbon atoms), etc.

The diallyl ethers (d1) of a dihydric phenol include bisphenol F diallyl ether, bisphenol A diallyl ether, bisphenol B diallyl ether, bisphenol AD diallyl ether, bisphenol S diallyl ether, halogenated bisphenol A diallyl ether, tetrachlorobisphenol A diallyl ether, catechin diallyl ether, resorcinol diallyl ether, hydroquinone diallyl ether, 1,5-dihydroxynaphthalene diallyl ether, dihydroxybiphenyl diallyl ether, octachloro-4,4'-dihydroxybiphenyl diallyl ether, tetramethylbiphenyl diallyl ether, 9,9'-bis(4-hydroxyphenyl)fluorene diallyl ether, etc.

The polyallyl ethers (d2) of a polyhydric phenol include pyrogallol triallyl ether, dihydroxynaphthylcresol triallyl ether, tris(hydroxyphenyl)methane triallyl ether, dinaphthyltriol triallyl ether, tetrakis(4-hydroxyphenyl)ethane tetraallyl ether, tris-methyl-tert-butyl-butylhydroxymethane triallyl ether, 4,4'-oxybis(1,4-phenylethyl)tetracresol allyl ether, 4,4'-oxybis(1,4-phenylethyl)phenyl allyl ether, bis(dihydroxynaphthalene) tetraallyl ether, etc.

The diallyl ethers (d3) of a dihydric alcohol include ethylene glycol diallyl ether, propylene glycol diallyl ether, tetramethylene glycol diallyl ether, 1,6-hexanediol diallyl ether, polyethylene glycol (Mw 150 to 4,000) diallyl ether, polypropylene glycol (Mw 180 to 5,000) diallyl ether, polytetramethylene glycol (Mw 200 to 5,000) diallyl ether, neopentyl glycol diallyl ether, diallyl ethers of adducts of EO and/or PO (1 to 20 moles) with bisphenol A, etc.

The polyallyl ethers (d4) of a 3 to 7 hydric or higher polyhydric alcohol include trimethylolpropane triallyl ether, glycerin triallyl ether, pentaerythritol tetraallyl ether, sorbitol hexaallyl ether, polyglycerin (polymerization degree: 2 to 5) polyallyl ethers, etc.

The polyallyl esters (d5) of an aromatic polycarboxylic acid include diallyl phthalate, diallyl isophthalate, diallyl terephthalate, triallyl trimellitate, etc.

The polyallyl esters (d6) of an aliphatic or alicyclic polycarboxylic acid include compounds (d5) hydrogenated at the aromatic nucleus, diallyl esters of a dimer acid, diallyl oxalate, diallyl maleate, diallyl succinate, diallyl glutarate, diallyl adipate, diallyl pimelate, triallyl tricarballylate, etc.

As the monomers (e) having only propenyloxy groups, useful are dipropenyl ether (e1) of a dihydric phenol (6 to 30 carbon atoms), polypropenyl ethers (e2) of a polyhydric phenol {6 to 50 or more carbon atoms, Mw 110 to 5,000, 3 to 6 hydric or higher}, dipropenyl ethers (e3) of a dihydric alcohol (alkylene glycols of 2 to 6 or more carbon atoms, or 1 to 90 mole AO adducts of dihydric phenols of 6 to 24 or more carbon atoms), polypropenyl ethers (e4) of a 3 to 7 hydric or higher polyhydric alcohol (3 to 50 or more carbon atoms, Mw 76 to 10,000), polypropenyl esters (e5) of a divalent to hexavalent or higher aromatic polycarboxylic acid (6 to 20 or more carbon atoms), polypropenyl esters (e6) of a divalent to hexavalent or higher aliphatic or alicyclic polycarboxylic acid (6 to 20 or more carbon atoms).

The dipropenyl ether (e1) of a dihydric phenol include bisphenol F dipropenyl ether, bisphenol A dipropenyl ether, bisphenol B dipropenyl ether, bisphenol AD dipropenyl ether, bisphenol S dipropenyl ether, halogenated bisphenol A dipropenyl ether, tetrachlorobisphenol A dipropenyl ether, catechin dipropenyl ether, resorcinol dipropenyl ether, hydroquinone dipropenyl ether, 1,5-dihydroxynaphthalene dipropenyl ether, dihydroxybiphenyl dipropenyl ether, octachloro-4,4'-dihydroxybiphenyl dipropenyl ether, tetramethylbiphenyl dipropenyl ether, 9,9'-bis(4-hydroxyphenyl)fluorene dipropenyl ether, etc.

The polypropenyl ethers (e2) of a polyhydric phenol include pyrogallol tripropenyl ether, dihydroxynaphthylcresol tripropenyl ether, tris(hydroxyphenyl)methane tripropenyl ether, dinaphthyltriol tripropenyl ether, tetrakis(4-hydroxyphenyl)ethane tetrapropenyl ether, tris-methyltertbutyl-butylhydroxymethane tripropenyl ether, 4,4'-oxybis(1,4-phenylethyl)tetracresol propenyl ether, 4,4'-oxybis(1,4-phenylethyl)phenyl propenyl ether, bis(dihydroxynaphthalene) tetrapropenyl ether, etc.

The dipropenyl ethers (e3) of a dihydric alcohol include ethylene glycol dipropenyl ether, propylene glycol dipropenyl ether, tetramethylene glycol dipropenyl ether, 1,6-hexanediol dipropenyl ether, polyethylene glycol (Mw 150 to 4,000) dipropenyl ether, polypropylene glycol (Mw 180 to 5,000) dipropenyl ether, polytetramethylene glycol (Mw 200 to 5,000) dipropenyl ether, neopentyl glycol dipropenyl ether, dipropenyl ethers of adducts of EO and/or PO (1 to 20 moles) with bisphenol A, etc.

The polypropenyl ethers (e4) of a 3 to 7 hydric or higher polyhydric alcohol include trimethylolpropane tripropenyl ether, glycerin tripropenyl ether, pentaerythritol tetrapropenyl ether, sorbitol hexapropenyl ether, polyglycerin (polymerization degree 2 to 5) polypropenyl ethers, etc.

The polypropenyl esters (e5) of an aromatic polycarboxylic acid include dipropenyl phthalate, dipropenyl isophthalate, dipropenyl terephthalate, tripropenyl trimellitate, etc.

The polypropenyl esters (e6) of an aliphatic or alicyclic polycarboxylic acid include compounds (d5) hydrogenated at the aromatic nucleus, dipropenyl esters of a dimer acid, dipropenyl oxalate, dipropenyl maleate, dipropenyl succinate, dipropenyl glutarate, dipropenyl adipate, dipropenyl pimelate, tripropenyl tricarballylate, etc.

The monomers (f) having an epoxy group and a (meth)acryloyl group include glycidyl (meth)acrylate, 3,4-epoxycyclohexylmethyl (meth)acrylate, etc.

The monomers (g) an epoxy group and a vinyl group include vinylcyclohexene monoxide, glycidyl vinyl ether, butadiene monoxide, etc.

The monomers (h) having a (meth)acryloyl group and a vinyloxy group as the crosslinking groups include vinyl (meth)acrylate, vinyloxyethyl (meth)acrylate, vinyloxypropyl (meth)acrylate, 3-vinyloxy-2-hydroxypropyl (meth)acrylate, 3-vinyloxy-2-chloropropyl (meth)acrylate, vinyloxybutyl (meth)acrylate, vinyloxyhexyl (meth)acrylate, etc. The monomers (h) include also vinyl ethers and alkenyl (meth)acrylates.

The vinyl ethers include propenyloxyethyl vinyl ether, propenyloxypropyl vinyl ether, vinyloxyethyl vinyl ether, vinyloxypropyl vinyl ether, allyloxyethyl vinyl ether, allyloxypropyl vinyl ether, hexenyloxyethyl vinyl ether, decenyloxypropyl vinyl ether, etc.

The alkenyl (meth)acrylates include butenyl (meth)acrylate, butenyloxyethyl (meth)acrylate, octenyloxypropyl (meth)acrylate, 3-butenyloxy-2-hydroxypropyl (meth)acrylate, 3-hexenyloxy-2-chloropropyl (meth)acrylate, octenyloxy (meth)acrylate, decenyloxyhexyl (meth)acrylate, etc.

The monomers (i) having a (meth)acryloyl group and an allyl group include allyl (meth)acrylate, allyloxyethyl (meth)acrylate, allyloxypropyl (meth)acrylate, 3-allyloxy-2-hydroxypropyl (meth)acrylate, 3-allyoxy-2-chloropropyl (meth)acrylate, allyloxybutyl (meth)acrylate, allyloxyhexyl (meth)acrylate, etc.

The monomers (j) having a (meth)acryloyl group and a propenyloxy group include propenyl (meth)acrylate, propenyloxyethyl (meth)acrylate, propenyloxypropyl (meth)acrylate, 3-propenyloxy-2-hydroxypropyl (meth)acrylate, 3-propenyloxy-2-chloropropyl (meth)acrylate, propenyloxybutyl (meth)acrylate, propenyloxyhexyl (meth)acrylate, etc.

As the monomers (k) having primary amino groups, useful are aliphatic polyamines (k1) (2 to 18 carbon atoms, having 2 to 7 amino groups), alicyclic polyamines (k2) (4 to 15 carbon atoms, having 2 to 3 amino groups), polyamidopolyamines (k3), polyetherpolyamines (k4), etc.

The aliphatic polyamines (k1) include alkylenediamines of 2 to 6 carbon atoms, polyalkylene (2 to 6 carbon atoms) polyamines, the above polyamines substituted by an alkyl (1 to 4 carbon atoms) or a hydroxyalkyl (2 to 4 carbon atoms), alicyclic ring- or heterocyclic ring-containing aliphatic polyamines (5 to 18 carbon atoms), aromatic ring-containing aliphatic polyamines (8 to 15 carbon atoms), etc.

The alkylenediamines include ethylenediamine, propylenediamine, trimethylenediamine, tetramethylenediamine, hexamethylenediamine, etc.

The polyalkylenepolyamines include diethylenetriamine, iminobispropylamine, bis(hexamethylene)triamine, triethylenetetramine, tetraethylenepentamine, pentaethylenehexamine, etc.

The alkyl- or hydroxyalkyl-substituted polyamines include dialkyl(1 to 3 carbon atoms)-aminopropylamine, trimethylhexamethylenediamine, aminoethylethanolamine, methyliminobispropylamines, etc.

The alicyclic ring- or heterocyclic ring-containing aliphatic polyamines include 3,9-bis(3-aminopropyl)-2,4,8,10-tetraoxaspiro[5.5]undecane, etc.

The aromatic ring-containing aliphatic polyamines include xylylenediamine, tetrachloro-p-xylylenediamine, etc.

The alicyclic polyamines (k2) include 1,3-diaminocyclohexane, isophoronediamine, menthenediamine, 4,4'-methylenedicyclohexanediamine (hydrogenated methylenedianiline), etc.

The polyamidopolyamines (k3) include polyamidopolyamines of Mw 80 to 2,000 which are derived by condensation of a dicarboxylic acid (dimer acid, etc.) with an excess amount (2 or more moles per mole of acid) of a polyamine (the above-mentioned alkylenediamine, polyalkylenepolyamine, etc.).

Commercially available polyamidopolyamines (trade name) are, for example, POLYMIDE (Sanyo Chemical Ind. Co.), TOHMIDE (Fuji Kasei K.K.), BARSAMIDE (Henkel Hakusui Corp.), LUCKAMIDE (Dainippon Ink & Chemicals, Inc.), and SANMIDE (Sanwa Kagaku K.K.), etc.

The polyetherpolyamines (k4) include hydrogenated cyanoethylation products of polyetherpolyols (2 to 6 hydric, Mw 90 to 2,000) [e.g., polyalkylene (2 to 8 carbon atoms) glycols, etc.].

As the monomers (m) having secondary amino groups, useful are derivatives of the compounds (k) obtained by substituting the primary amino group (—NH$_2$) with —NH—R(R: an alkyl of 1 to 4 carbon atoms), such as di(methylamino)ethylene, di(ethylamino)hexane, 1,3-di(methylamino)cyclohexane, etc.

As the monomers (n) having only carboxyl groups, useful are divalent to hexavalent or higher aromatic polycarboxylic acids (6 to 20 or more carbon) (n1), and divalent to hexavalent or higher aliphatic or alicyclic polycarboxylic acids (n2) (6 to 20 or more carbon atoms).

The aromatic polycarboxylic acids (n1) include phthalic acid, isophthalic acid, terephthalic acid, himic acid, trimellitic acid, etc.

The aliphatic or alicyclic polycarboxylic acids (n2) include hydrogenated products of the compounds (n1) having a hydrogenated aromatic nucleus, dimer acids, oxalic acid, maleic acid, succinic acid, glutaric acid, adipic acid, azelaic acid, sebacic acid, tricarballylic acid, dodecenylsuccinic acid, etc.

As the monomers (O) having only hydroxyl groups, useful are dihydric phenols (o1) of 6 to 30 carbon atoms, polyhydric phenols (o2) (6 to 50 or more carbon atoms, Mw 110 to 5,000, 3 to 6 hydric or higher), dihydric alcohols (o3) (alkylene glycols of 2 to 6 or more carbon atoms, or adducts of 1 to 90 moles of AO with dihydric phenols of 6 to 24 or more carbon atoms), 3 to 7 hydric or higher polyhydric alcohols (o4) (3 to 50 or more carbon atoms, Mw 76 to 10,000), etc.

The dihydric phenols (o1) include bisphenol F, bisphenol A, bisphenol B, bisphenol AD, bisphenol S, halogenated bisphenol A (e.g., tetrachlorobisphenol A, etc.), catechin, resorcinol, hydroquinone, 1,5-dihydroxynaphthalene, dihydroxybiphenyl, octachloro-4,4'-dihydroxybiphenyl, tetramethylbiphenyl, 9,9'-bis(4-hydroxyphenyl)fluorene, etc.

The polyhydric phenols (o2) include pyrogallol, dihydroxynaphthylcresol, tris(hydroxyphenyl)methane, dinaphthyltriol, tetrakis(4-hydroxyphenyl)ethane, tris-methyl-tert-butyl-butylhydroxymethane, 4,4'-oxybis(1,4-phenylethyl)tetracresol, 4,4'-oxybis(1,4-phenylethyl)phenyl, bis(dihydroxynaphthalene), etc.

The dihydric alcohols (o3) include ethylene glycol, propylene glycol, tetramethylene glycol, 1,6-hexanediol, polyethylene glycol (Mw 150 to 4,000), polypropylene glycol (Mw 180 to 5,000), polytetramethylene glycol (Mw 200 to 5,000), neopentyl glycol, adducts of EO and/or PO (1 to 20 moles) with bisphenol A, etc.

The polyhydric alcohols (o4) include trimethylolpropane, ditrimethylolpropane, glycerin, pentaerythritol, dipentaerythritol, sorbitol, polyglycerin (polymerization degree 2 to 5), etc.

As the monomers (p) having only isocyanato groups, useful are aromatic polyisocyanates (p1) of 6 to 20 carbon atoms (excluding the carbon atom in the NCO group, hereinafter the same), aliphatic isocyanates (p2) of 2 to 18 carbon atoms, alicyclic polyisocyanates (p3) of 4 to 15 carbon atoms, aromatic aliphatic polyisocyanates (p4) of 8 to 15 carbon atoms, modified products (p5) of the above polyisocyanates (modified products containing a group of urethane, carbodiimide, allophanate, urea, biuret, urethodione, urethoimine, isocyanurate, oxazolidone, or the like), etc.

The aromatic polyisocyanates (p1) include 1,3- or 1,4-phenylene diisocyanate, 2,4- or 2,6-tolylene diisocyanate (TDI), crude TDI, 2,4'- or 4,4'-diphenylmethane diisocyanate (MDI), 4,4'-diisocyanatobiphenyl, 3,3'-dimethyl-4,4'-diisocyanatobiphenyl, 3,3'-dimethyl-4,4'-diisocyanatodiphenylmethane, crude MDI [phosgenated product of crude diaminophenylmethane [condensation product of formaldehyde with an aromatic amine (aniline) or a mixture thereof; a mixture of diaminodiphenylmethane and a small amount (e.g., 5 to 20 mass %) of a 3- or more functional polyamine]: polyaryl polyisocyanate (PAPI)], 1,5-naphthylene diisocyanate, 4,4',4"-triphenylmethane triisocyanate, m- or p-isocyanatophenylsulfonyl isocyanate, etc.

The aliphatic polyisocyanates (p2) include ethylene diisocyanate, tetramethylene diisocyanate, hexamethylene diisocyanate (HDI), dodecamethylene diisocyanate, 1,6,11-uncecane triisocyanate, 2,2,4-trimethylhexamethylene diisocyanate, lysine diisocyanate, 2,6-dicyanato methyl caproate, bis(2-isocyanatoethyl) fumarate, bis(2-cyanatoethyl) carbonate, 2-cyanatoethyl 2,6-diisocyanatohexanoate, etc.

The alicyclic polyisocyanate (p3) include isophorone diisocyanate (IPDI), dicyclohexylmethane-4,4'-diisocyanate (hydrogenated TDI), cyclohexylene diisocyanate, methylcyclohexylene diisocyanate (hydrogenated TDI), bis(2-isocyanatoethyl) 4-cyclohexene-1,2-dicarboxylate, 2,5- or 2,6-norbornane diisocyanate, etc.

The aromatic aliphatic polyisocyanates (p4) include m- or p-xylylene diisocyanate (XDI), α,α,α',α'-tetramethylxylylene diisocyanate (TMXDI), etc.

The modified products (p5) of the above polyisocyanates include modified MDIs (urethane-modified MDI, carbodiimide-modified MDI, and trihydrocarbyl phosphate-modified MDI), urethane-modified TDI, buiret-modified HDI, isocyanurate-modified HDI, isocyanurate-modified IPDI, and the like modified polyisocyanates, and mixtures of two or more thereof [e.g., combination of a modified MDI and a urethane-modified TDI (isocyanate-containing prepolymer)]. For production of a urethane-modified polyisocyanate [a resin (prepolymer) containing a free isocyanate (reactive functional group) by reaction of an excess amount of a polyisocyanate (TDI, MDI, or the like) and a polyol], the polyol used has an equivalent of 30 to 200. The polyol includes glycols (ethylene glycol, propylene glycol, diethylene glycol, dipropylene glycol, etc.), triols (trimethylolpropane, glycerin, etc.), higher functional polyols (pentaerythritol, sorbitol, etc.), and adducts of AO (EO and/or PO 1 to 20 moles), and so forth.

The monomers (q) having a nitrile group and a vinyloxy group include cyanobutene, cyanovinyloxybenzene, etc.

The monomers (r) having a nitrile group and a (meth)acryloyl group include (meth)acrylonitrile, cyanoethyl (meth)acrylate, etc.

The monomers (s) having a hydroxyl group and a (meth)acryloyl group include mono(meth)acrylate (Mw 300 to 3,000) having a polyalkylene (2 to 8 carbon atoms) glycol chain, such as polyethylene glycol (Mw 300) mono(meth)acrylate, polypropylene glycol (Mw 500) mono(meth)acrylate, ethylene glycol mono(meth)acrylate, propylene glycol mono(meth)acrylate, glycerin mono(meth)acrylate, trimethylolpropane mono(meth)acrylate, pentaerythritol mono(meth)acrylate, polyglycerin (polymerization degree being the same as above) mono(meth)acrylate, etc.

The monomers (t) having a (meth)acryloyl group and an isocyanato group include 2-(meth)acryloylethyl isocyanate, and (meth)acryloylpropyl isocyanate, etc.

The monomers (u) having a (meth)acryloyl group and a carboxyl group include (meth)acrylic acid, maleic acid, maleic anhydride, etc.

The monomers (v) having allylamino groups includes derivatives of the compounds (k) obtained by substituting at least a part of the primary amino groups (—NH$_2$) with —NH—R (R: an allyl group) such as di(allylamino)ethylene, di(allylamino)propylene, 4,7,10-triazatrideca-1,12-diene, 4,7,10,13-tetraazahexadeca-1,15-diene, di(allylamino)hexane, N,N-diallylxylylenediamine, N,N-di(allylamino)cyclohexane, N,N-diallylisophoronediamine, etc.

The monomers (w) having propenylamino groups include derivatives of the compounds (k) obtained by substituting at least a part of the primary amino groups (—NH$_2$) with —NH—R (R: a propenyl group), such as di(propenylamino)ethylene, di(propenylamino)propylene, 4,7,10-triazatrideca-2,11-diene, 4,7,10,13-tetraazahexadeca-2,14-diene, di(propenylamino)hexane, N,N-dipropenylxylylenedamine, N,N-di(propenylamino) cyclohexane, N,N-dipropenylisophoronediamine, etc.

Of the monomers having the above crosslinking functional groups, preferable are those of (a)–(f), (n), (o), (q)–(s), and (u); more preferable are (a)–(f), (n), (o), (s), and (u); still more preferable are (a), (b), and (f); still more preferable are (a), (b), and (f); and particularly preferable are (a) and (f). These monomers may be used singly, in combination of two or more thereof, and/or with an additional copolymerizable monomer.

As the additional copolymerizable monomer, useful are the monomers (aa)–(ww) below.

As the monomer (aa) copolymerizable with the monomer (a) having only epoxy groups, useful are hydrocarbon oxides (aa1) of 4 to 24 carbon atoms, monoglycidyl ethers (aa2) of a hydrocarbon (3 to 21 carbon atoms), aliphatic carboxylic acids (aa3) of 1 to 18 carbon atoms, aromatic carboxylic acids (aa4) of 7 to 18 carbon atoms, alcohols (aa5) of 1 to 18 carbon atoms, phenols (aa6) of 6 to 18 carbon atoms, aliphatic amines (aa7) of 1 to 18 carbon atoms, and aromatic amines (aa8) of 6 to 18 carbon atoms.

The hydrocarbon oxides (aa1) include EO, PO, butene oxide, α-olefin oxides of 5 to 18 carbon atoms (e.g., pentane oxide, decene oxide, octadecene oxide, etc.), styrene oxide, etc.

The monoglycidyl ethers (aa2) of a hydrocarbon (4 to 21 carbon atoms) include methyl glycidyl ether, propyl glycidyl ether, butyl glycidyl ether, 2-ethylhexyl glycidyl ether, phenyl glycidyl ether, octadecyl glycidyl ether, etc.

The aliphatic carboxylic acids (aa3) include acetic acid, butanoic acid, 2-ethylhexanoic acid, undecanoic acid, octadecanoic acid, etc.

The aromatic carboxylic acids (aa4) include benzoic acid, p-methylbenzoic acid, naphthalene carboxylic acid, etc.

The alcohols (aa5) include methanol, isopropanol, butanol, 2-ethylhexanol, tetradecyl alcohol, octadecyl alcohol, benzyl alcohol, etc.

The phenols (aa6) include phenol, o-, m-, or p-cresol, p-ethylphenol, etc.

The aliphatic amines (aa7) include methylamine, dimethylamine, methylbutylamine, undecylamine, decalylamine, octadecylamine, etc.

The aromatic amines (aa8) include aniline, pmethylaniline, p-undecylaniline, m-methoxyaniline, naphthylamine, etc.

As the monomer (bb) copolymerizable with the monomer (b) having only (meth)acryloyl groups, useful are olefins (bb1) of 4 to 20 carbon atoms, aromatic compounds (bb2) of 8 to 18 carbon atoms having polymerizable unsaturated double bonds, alkyl (meth)acrylates (bb3) of 5 to 22 carbon atoms, polymerizable aliphatic acid esters (bb4) of 4 to 20 carbon atoms, vinyl ethers (bb5) of 4 to 20 carbon atoms, etc.

The olefins (bb1) include ethylene, propylene, butene, 1-octene, 1-decene, 1-eicosene, 6-methyl-1,4:5,8-dimethano-1,4,4a,5,6,7,8,8a-octahydronaphthalene, norbornene, dicyclopentadiene, 5-ethylidene-2-norbornene, etc.

The aromatic compounds (bb2) having a polymerizable double bond include styrene, α-methylstyrene, p-methylstyrene, o-methylstyrene, m-methylstyrene, p-decylstyrene, o-bromostyrene, m-bromostyrene, p-iodostyrene, p-chlorostyrene, m-chlorostyrene, p-chlorostyrene, o-fluorostyrene, m-fluorostyrene, p-fluorostyrene, 2,6-dichlorostyrene, 2,6-difluorostyrene, 2,3,4,5,6-pentafluorostyrene, divinylbenzene, etc.

The alkyl (meth)acrylates (bb3) include methyl (meth)acrylate, ethyl (meth)acrylate, butyl (meth)acrylate, undecyl (meth)acrylate, octadecyl (meth)acrylate, cyclohexyl (meth)acrylate, isobornyl (meth)acrylate, adamantyl (meth)acrylate, 3-methylcyclohexyl (meth)acrylate, cyclopentenyl (meth)acrylate, cyclohexenyl (meth)acrylate, etc.

The polymerizable aliphatic acid esters (bb4) include vinyl acetate, vinyl propanoate, vinyl octadecanoate, allyl acetate, allyl butanoate, propenyl acetate, propenyl hexanoate, etc.

The vinyl ethers (bb5) include ethyl vinyl ether, octyl vinyl ether, octadecyl vinyl ether, cyclohexyl vinyl ether, isobornyl vinyl ether, adamantyl vinyl ether, 3-methylcyclohexyl vinyl ether, cyclopentenyl vinyl ether, cyclohexenyl vinyl ether, etc.

The monomers (bb) are useful as the monomers (cc) copolymerizable with the monomer (c) having only vinyloxy groups, as the monomers (dd) copolymerizable with the monomer (d) having only allyloxy groups, and as the monomers (ee) copolymerizable with the monomer (e) having only propenyloxy groups.

As the monomers (ff) copolymerizable with the monomers (f) having an epoxy group and a (meth)acryloyl group, useful are the monomers (aa) and (bb), etc.

As the monomers (gg) copolymerizable with the monomers (g) having an epoxy group and a vinyl group, useful are the monomers (aa) and (bb), etc.

As the monomers (hh) copolymerizable with the monomers (h) having a (meth)acryloyl group and a vinyloxy group, useful are the monomers (bb), etc.

As the monomers (ii) copolymerizable with the monomers (i) having a (meth)acryloyl group and an allyloxy group, useful are the monomers (bb), etc.

As the monomers (jj) copolymerizable with the monomers (j) having a (meth)acryloyl group and a propenyloxy group, useful are the monomers (bb), etc.

As the monomers (kk) copolymerizable with the monomers (k) having primary amino groups, useful are the monomers (aa1) to (aa4), etc.

As the monomers (mm) copolymerizable with the monomers (m) having secondary amino groups, useful are the monomers (aa1) to (aa4), etc.

As the monomers (nn) copolymerizable with the monomers (n) having only carboxyl groups, useful are the monomers (aa1), (aa2), (aa5) to (aa8), etc.

As the monomers (oo) copolymerizable with the monomers (oo) having only hydroxyl groups, useful are the monomers (aa1) to (aa4), etc.

As the monomers (pp) copolymerizable with the monomers (p) having only isocyanato groups, useful are the monomers (aa), etc.

As the monomers (qq) copolymerizable with the monomers (q) having a nitrile group and a vinyloxy group, useful are the monomers (bb), etc.

As the monomers (rr) copolymerizable with the monomers (r) having a nitrile group and an acryloyl group, useful are the monomers (bb), etc.

As the monomers (ss) copolymerizable with the monomers (s) having a hydroxyl group and a (meth)acryloyl group, useful are the monomers (aa1) to (aa4), (bb), etc.

As the monomers (tt) copolymerizable with the monomers (t) having a (meth)acryloyl group and an isocyanato group, useful are the monomers (aa), (bb), etc.

As the monomers (uu) copolymerizable with the monomers (u) having a (meth)acryloyl group and a carboxyl group, useful are the monomers (aa1), (aa2), (aa5) to (aa8), (bb), etc.

As the monomers (vv) copolymerizable with the monomers (v) having allylamino groups, useful are the monomers (aa1) to (aa4), (bb), etc.

As the monomers (ww) copolymerizable with the monomers (w) having propenylamino groups, useful are the monomers (aa1) to (aa4), (bb), etc.

Of the above-mentioned additional copolymerizable monomers, in view of heat resistance, electrical properties, and resin strength, preferable are the monomers (aa) and (bb), more preferable are (bb), still more preferable are (bb1), (bb2), and (bb3), still more preferable are (bb1), and (bb2), particularly preferable are styrene, ethylene, propylene, 6-methyl-1,4:5,8-dimethano-1,4,4a,5,6,7,8,8a-octahydronaphthalene, norbornene, dicyclpentadiene, and 5-ethylidene-2-norbornene.

The above-mentioned additional copolymerizable monomers may be used singly or in combination of two or more thereof.

In use of the additional copolymerizable monomer, the content thereof is not specially limited, but is preferably in the range of 20 to 80 wt %, more preferably 35 to 70 wt %, still more preferably 50 to 60 wt % based on the total weight of the used monomers in view of the heat resistance and the resin strength.

① The process of (co)polymerization of the monomer(s) having a crosslinking functional group is not limited, and can be conducted in a conventional manner. For example, a monomer having a crosslinking functional group is placed in a reaction vessel purged with nitrogen as necessary; the additional copolymerizable monomer is added thereto dropwise as necessary; and the mixture is aged for a suitable time.

The reaction temperature is usually 0 to 180° C., preferably 60 to 150° C. The time for the aging is usually 0 to 50 hours, preferably 4 to 15 hours.

In the case where two or more monomers are used, the polymerization type may be either of a block type or of a random type.

In the polymerization, a solvent may be used. The solvent is not specially limited, provided that the solvent does not harmed the reaction and is capable of dissolving the monomer and the formed resin. The solvent includes aromatic solvents (e.g., toluene, xylene, etc.), ketone solvents (e.g., acetone, methyl ethyl ketone, methyl isobutyl ketone, etc.), ether solvents (e.g., diethyl ether, dioxane, tatrahydrofuran, etc.), chlorine type solvents (e.g., chloroform, carbon tetrachloride, dichloromethane, etc.), and the like.

The amount of the solvent, when used, is in the range of 20 to 100%, preferable 25 to 80%, more preferably 30 to 65% by weight based on the total weight of the monomers.

A reaction initiator (C) may be used. This reaction initiator (C) may be conventional one, and is not limited specially, being selected from radical reaction initiation catalysts (C1), cationic polymerization initiation catalysts (C2), esterification catalysts (C3), amidation catalysts (C4), epoxy ring-opening catalysts (C5), isocyanate reaction catalysts (C6), etc. depending on the kind of the crosslinking functional group.

The radical reaction initiation catalysts (C1) include thermal radical reaction initiation catalyst (C11), photo-induced radical reaction initiation catalysts (C12), etc.

The thermal radical initiation catalyst (C11) has a 10-hour half-life temperature of preferably not lower than 80° C., more preferably not lower than 120° C., and are selected from peroxides, azo compounds, etc.

The peroxides include t-butyl peroxyacetate, t-butyl peroxybenzoate, dicumyl peroxide, t-butylcumyl peroxide, 2,5-dimethyl-2,5-di(t-butylperoxy)hexyne-3, cumene hydroperoxide, benzoyl peroxide, bis(t-butylperoxy) diisopropylbenzene, di-t-butyl peroxide, 2,5-dimethyl-2,5-bis(t-butylperoxy)hexane, t-butylcumyl peroxide, P-menthane hydroperoxide, 2,5-dimethyl-2,5-bis(t-butylperoxy)hexyne-3, dicumyl peroxide, etc.

The azo compounds include 2,2'-azobis(2,4-dimethylvaleronitrile), 2,2'-azobisisobutyronitrile, 1,1'-azobis(1-cyclohexanecarbonitrile), etc.

The photo-induced radical reaction initiation catalysts (C12) include benzoin alkyl ether, benzyl dimethyl ketal, 1-hydroxycyclohexyl phenyl ketone, 2-hydroxy-2-methyl-1-phenyl-propan-1-one, benzophenone, methylbenzoyl formate, isopropylthioxanthone, etc.

Additionally, a sensitizer may be used together with the photo-induced radical reaction initiation catalyst (C12), the sensitizer including nitro compounds (e.g., carbonyl compounds such as anthraquinone, 1,2-naphthoquinone, 1,4-naphthoquinone, benzanthrone, p,p'-tetramethyldiaminobenzophenone, and chloranil; nitrobenzene, p-dinitrobenzene, 2-nitrofluorene, etc.), aromatic hydrocarbons (e.g., anthracene, chrysene, etc.), sulfur compounds (e.g., diphenyl disulfide, etc.), and nitrogen compounds (e.g., nitroaniline, 2-chloro-4-nitroaniline, 5-nitro-2-aminotoluene, tetracyanoethylene, etc.), etc.

The cationic polymerization catalysts (C2) include thermal cationic polymerization catalysts (C21), photo-induced cationic polymerization catalysts (C22), etc.

The thermal cationic polymerization catalysts (C21) include onium salt type catalysts (e.g., triaryl sulfonium salts, diaryl iodonium salts, etc.), etc.; for example, SAN AID SI series (trade name, produced by Sanshin Kagaku Kogyo K.K.).

The photo-induced cationic polymerization catalysts (C22) include triphenylsulfonium hexafluoroantimonate, triphenylsulfonium phosphate, p-(phenylthio)phenyl-diphenylsulfonium hexafluoroantimonate, p-(phenylthio)phenyl-diphenylsulfonium hexafluorophosphate, 4-chlorophenyl-diphenylsulfonium hexafluorophosphate, 4-chlorophenyl-diphenylsulfonium hexafluoroantimonate, bis[4-(diphenylsulfonio)phenyl]sulfido bishexafluorophosphate, bis[4-(diphenylsulfonio)phenyl]sulfido bishexafluoroantimonate, (2,4-cyclopentadien-1-yl)[(1-methylethyl)benzene]-Fe hexafluorophosphate, diallyliodonium haxafluoroantimonate, etc.

These catalyst materials are readily available commercially: for example, SP-150, and SP-170 (trade name, produced by Asahi Denka Kogyo K.K.); IRGACURE-261 (trade name, produced by Ciba Geigy Co.); UVR-6974, and UVR-6990 (trade name, produced by Union Carbide Co.); CI-2855 (trade name, produced by Nippon Soda Co.); CD-1012 (trade name, produced by Sahtoma Co.), etc.

The esterification catalysts (C3) and the amidation catalysts (C4) include acid catalysts (hydrochloric acid, sulfuric acid, phosphoric acid, methanesulfonic acid, p-toluenesulfonic acid, trifluoroborane, etc.), alkalies (e.g., sodium hydroxide, potassium hydroxide, 1,8-diazabicyclo[5.4.0]undecene-7 (DBU, registered trademark, produced by Sun Apro Co.), etc.), metal complexes (e.g., tetrapropyltitanium, etc.), etc.

The epoxy ring-opening catalysts (C5) include imidazole catalysts (2-methylimidazole, 2-ethyl-4-methylimidazole, 2-undecylimidazole, 2-heptadecylimidazole, 2-phenylimidazole, 1-benzyl-2-methylimidazole, 1-cyanoethyl-2-methylimidazole, etc.), tertiary amines (benzylmethylamine, 2-(dimethylaminomethyl)phenol, 2,4,6-tris(diaminomethyl)phenol, triethylamine, DBU, etc.), onium salts (San Aid SI series produced by Sanshin Kagaku Kogyo K.K.; etc.), etc.

The isocyanate reaction catalysts (C6) include organometallic compounds (e.g., trimethyltin laurate, trimethyltin hydroxide, dimethyltin dilaurate, dibutyltin diacetate, dibutyltin dilaurate, stannous octoate, dibutyltin maleate, lead oleate, lead 2-ethylhexanoate, lead naphthenate, lead octenoate, bismuth octanoate, bismuth naphthenate, cobalt naphthenate, phenylmercury propionate, etc.), tertiary amines (e.g., DBU, N-methylmorpholine, N-ethylmorpholine, methyldibutylamine, triethylamine, and their carbonate and salts of organic acids of 1 to 8 carbon atoms (formate, etc.) etc.), etc.

The reaction initiator (C) may be used singly or as a mixture of two or more thereof.

In use of the reaction initiator (C), the amount of (C) to be used is preferably 0.001 to 3.0 wt %, more preferably 0.01 to 2.0 wt %, still more preferably 0.05 to 1.0 wt % based on the total weight of the monomers.

A polymerization inhibitor may be used for leaving at least two crosslinking functional group in the resin (A). The polymerization initiator is not specially limited, and the ones which are used conventionally for usual reactions are useful, including diphenylhydrazyl, tri-p-nitrophenylmethyl, N-(3-N-oxyanilino-1,3-dimethylbutylidene)aniline oxide, p-benzoquinone, p-tert-butylcathecol, nitrobenzene, picric acid, dithiobenzoyl disulfide, copper (II) chloride, etc.

In use of the polymerization inhibitor, the amount of the polymerization initiator to be used is preferably 0.1 to 5.0 wt %, more preferably 0.1 to 2.0 wt %, still more preferably 0.5 to 1.0 wt % based on the total weight of the monomers.

② The process of conversion of the crosslinking functional group of a resin having a crosslinking functional group by reaction with a monomer having a crosslinking functional group is not limited specially, but can be conducted by a conventional manner. In one process, for example, a resin having a reactive functional group is produced from a monomer (q–w) and the resin is converted by reaction of a monomer (k–p); in another process, a resin produced by the process ① and having at least two crosslinking functional groups is allowed to react with a monomer (a–j) or a monomer (q–w).

The reaction temperature, the aging time, the solvent, the reaction initiator (C), and the polymerization inhibitor are the same as those mentioned in the process ①.

For example, a resin is produced by copolymerization of hydroxyethyl (meth)acrylate (20 to 80 parts by weight) and styrene (80 to 20 parts by weight), and the resulting resin is allowed to react with (meth)acrylic acid for esterification to convert the hydroxyl groups to (meth)acryloyl groups.

Otherwise, to a resin having an unsaturated double bond, a monomer (a–j, v, w) having a crosslinking functional group is introduced by graft reaction.

For example, 20 to 40 mole parts of propylene and 60 to 80 mole parts of 5-ethylidene-2-norbornene are addition-copolymerized by use of a solvent and a catalyst of a transition metal compound type (e.g., a titanium compound)/aluminum compound or a like catalyst to obtain a copolymer, and to the copolymer, glycidyl (meth)acrylate, vinylcyclohexene monoxide, 3,4-epoxycyclohexylmethyl (meth)acrylate or a like monomer can be grafted to convert the unsaturated double bond to an epoxy group.

The curable resin (A) of the present invention is preferably used in combination with a low-molecular compound (B) which has at least two crosslinking functional groups of at least one kind selected from the group consisting of epoxy, (meth)acryloyl, and alkenyloxy group, as a curable resin composition in view of the thermal resistance and the dielectric properties.

The low molecular weight compound (B) has an Mw of preferably 170 to 3,000, more preferably 200 to 1,500, still more preferably 500 to 1,200, still more preferably 600 to 1,000. The Mw is preferably in this range in view of the thermal resistance and the ease of handling.

The crosslinking functional group of the low molecular weight compound (B) is of the same kind as that of the resin (A), and the same functional groups are preferred.

The number of the crosslinking groups of the compound (B) is at least two, preferably 2 to 5,000, more preferably 3 to 3,000, still more preferably 5 to 1,000, still more preferably 7 to 500, most preferably 10 to 200.

As the compound (B), useful are the monomers (a–j), monomers (q–w), (aa1), (aa2), (bb3), (bb4), etc. In addition to those, a monoepoxide (x), a polyepoxide (y), a curing agent (z), or the like may be used.

The monoepoxide (x) includes glycidyl esters (x1) of a monocarboxylic acid (3 to 30 carbon atoms), cyclohexene monoxide group-containing compound (x2).

The glycidyl esters (x1) of a monocarboxylic acid include glycidyl (meth)acrylate, epihalohydrin (e.g., epichlorohydrin, epibromohydrin, etc.), hydroxyl group-containing oxide (e.g., glycidol, etc.), etc.

The cyclohexene monoxide group-containing compounds (x2) include 3,4-epoxycyclohexylmethyl-3',4'-epoxymethylcyclohexanecarboxylate, 3,4-epoxy-6-methylcyclohexylmethyl-3',4'-epoxy-6'-methylcylohexanecarboxylate, etc.

The polyepoxides (y) include vinylcyclohexene dioxide, bis(3,4-epoxy-6-methylcyclohexylmethyl) adipate, glycidyl ethers of a phenol- or cresol-novolak resin (Mw 400 to 3,000), glycidyl ethers of a limonene-phenol novolak resin (Mw 400 to 3,000), glycidyl ethers of a polyphenol (Mw 400 to 3,000) prepared by condensation reaction of phenol with glyoxal, glutaraldehyde, or formaldehyde, polyglycidyl ethers of polyphenol of Mw 400 to 3,000 prepared by condensation reaction of resorcin and acetone, glycidyl (meth)acrylate (co)polymers (e.g., polymerization degree 2 to 10), epoxidated polybutadiene (Mw 170 to 3000) of an epoxy equivalent of 130 to 1,000, epoxidated soy bean oil (Mw 170 to 3,000), etc.

The curing agents (z) include monomers (n) having only carboxyl groups, acid anhydrides of aliphatic carboxylic acids (aa3) and of aromatic carboxylic acids (aa4), etc.

Of the above low molecular compounds (B), preferable are (a), (b), (c), (d), (e), (m), (n), (f), (g), (h), (r), (s), (i), (j), (m), (aa3), and (aa4); more preferable are (a), (b), (n), (f), (g) and (s); still more preferable are (a), (b), (n), and (f).

In use of the monoepoxide (x), the polyepoxide (y), and the curing agent (z), the amounts to be used is not specially limited, but is preferably 20 to 80 wt %, more preferably 30 to 70 wt %, still more preferably 40 to 60 wt % in view of the heat resistance and strength of the resin.

The weight ratio (A:B) of (A) to (B) is preferably 10 to 95:5 to 90, more preferably 20 to 90:10 to 80, still more preferably 30 to 80:20 to 70.

(2) Second and Third of Present Invention:

The difference in the solubility parameter (hereinafter referred to as "SP") between the curable resin composition (X) and the thermoplastic resin (Y) should be 0.5 to 3.0, preferably 0.6 to 2.5, more preferably 0.7 to 2.0, still more preferably 0.8 to 1.8, still more preferably 0.9 to 1.5, most preferably 1.0 to 1.2. Within this range of the solubility parameters, high thermal impact strength of the insulator can be obtained.

The SP value of the curable resin composition is preferably 5.0 to 12.0, more preferably 6.0 to 11.5, still more preferably 7.0 to 11.0, still more preferably 8.0 to 10.5, most preferably 9.0 to 10.0.

The SP value is represented by the equation below:

$$SP\ \text{value}\ (\delta) = (\Delta H/V)^{1/2}$$

where $\Delta H$ indicates a molar evaporation heat (cal), and V indicates a molar volume (cm$^3$). The values $\Delta H$ and V may be the sum ($\Delta H$) of the molar evaporation heats ($\Delta ei$), and the sum (V) of the molar volumes ($\Delta vi$) of atomic groups described in POLYMER ENGINEERING February, 1974, Vol. 14, No.2, Robert F. Fedors (pp. 151–153).

The Mw of the aforementioned thermoplastic resin (Y) is 3,000 to 1,000,000, preferably 5,000 to 800,000, more preferably 10,000 to 600,000, still more preferably 50,000 to 400,000, most preferably 60,000 to 100,000.

The dielectric constant of the aforementioned curable resin composition (X) after curing is preferably not higher than 3.5, more preferably 2 to 3.5, still more preferably 2.2 to 3.4, still more preferably 2.4 to 3.3, still more preferably 2.7 to 3.2.

Within this range of the dielectric constant after curing, the insulator prepared from the resin has higher reliability. By use thereof for integrated circuits of electronic parts and the like, the performance of the circuit can readily be made higher by preventing signal delay.

The conditions of curing and the method of dielectric constant measurement are the same as those for the curable resin (A).

The boiling water absorption percentage of (X) after curing is preferably not higher than 3%, preferably 3.00 to 0.001, more preferably 2.5 to 0.005, still more preferably 2 to 0.001%.

The curing conditions were the same as the conditions for measurement of the dielectric constant. The boiling water absorption percentage is measured according to JIS K7209 (2000) 6.3B.

The dielectric constant of the curable resin material after curing is preferably 2.4 to 3.2, more preferably 2.5 to 3.2, still more preferably 2.5 to 3.0, still more preferably 2.6 to 2.9, most preferably 2.6 to 2.8. Within this range of the dielectric constant after curing, the insulator prepared from the resin has higher reliability. By use thereof for integrated wirings of electronic parts and the like, the performance of the wiring can readily be made higher by preventing signal delay.

The conditions of curing and the method of the dielectric constant measurement are the same as those for the curable resin (A).

The curable resin composition (X) may contain a resin selected from a variety of resins curable by heating or a like method. In view of the thermal shock resistance, the three types of resin compositions below are preferable.

(1) A curable resin composition (X1) which comprises a curable resin (A) and a low molecular weight compound (B) as described above.

(2) A curable resin composition (X2) which comprises: a copolymer (H) containing an α-olefin (Ha) and a cyclic olefin (Hb) as constitution units, and the copolymer (H) has a carbon-carbon double bond; and a crosslinking agent (I) having a carbon-carbon double bond as essential components.

(3) A curable resin compositions (X3) which comprises a copolymer (J) containing at least one monomer (fgw) selected from the group consisting of monomers (f) having an epoxy group and a (meth)acryloyl group, monomers (g) having an epoxy group and a vinyl group, monomers (h) having a (meth)acryloyl group and a vinyloxy group, monomers (i) having a (meth)acryloyl group and an allyloxy group, monomers (j) having a (meth)acryloyl group and a propenyloxy group, monomers (v) having an allylamino group, and monomers (w) having a propenylamino group; and a monomer (345) selected from the monomers represented by Formulas (3) to (5); and, as necessary, at least one monomer (bb235) selected from the group consisting of aromatic compounds (bb2) of 8 to 18 carbon atoms having a polymerizable unsaturated double bond, alkyl (meth)acrylates (bb3) of 5 to 22 carbon atoms, and vinyl ethers (bb5) of 4 to 20 carbon atoms, in which the copolymer (J) having a Mw of 2,000 to 1,000,000.

$$CF_2 = CF - O - C_n F_{2n+1} \qquad (3)$$

In Formula (3), the symbol n represents an integer of 1 to 10.

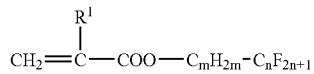

(4)

In formula (4), $R^1$ represents a hydrogen atom or a methyl group, m represents an integer of 0 to 6, and n represents an integer of 1 to 10.

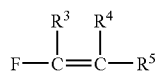

(5)

In Formula (5), $R^3$ represents a hydrogen atom or a fluorine atom, $R^4$ represents a hydrogen atom, a chlorine atom, or a fluorine atom, and $R^5$ represents a hydrogen atom, a fluorine atom, or a trifluoromethyl group.

The curable resin composition (X1) is explained firstly.

The composition (X1) may contain the other additive (D), the other resin (E), a rubber (F), a filler (G), etc.

The other additive (D) includes phenol type age resistors, phosphorus type age resistors, flame retardants, phenol type thermal deterioration inhibitors, benzophenone type UV stabilizers, antistatic agents, etc.

In using (D), the content of (D) is preferably 0.001 to 3.0 wt %, more preferably 0.01 to 2.0 wt %, still more preferably 0.05 to 1.0 wt % based on the total weight of (A) and (B).

The other resin (E) includes conventional resins used conventionally for insulators, such as ABS resins, polystyrene, polycarbonate, polyamide, polyphenylene oxide, polyethylene terephthalate, polybutylene terephthalate, polyphenylene sulfide, polyimide, polysulfone, polyether sulfone, and polyarylate.

The Mw of the other resin (E) is preferably 10,000 to 500,000, more preferably 20,000 to 100,000, still more preferably 40,000 to 60,000.

In using the other resin (E), the content of (E) is preferably 0.1 to 20 wt %, more preferably 1 to 10 wt %, still more preferably 2 to 8 wt %, still more preferably 3 to 5 wt % based on the total weight of (A) and (B).

The rubber (F) includes isoprene rubber, butadiene rubber, styrene-butadiene rubber, styrene/isoprene rubber, nitrile rubber, chloroprene rubber, and ethylene-propylene rubber.

The elongation of rubber (JIS K6301 (1995) 3. Tensile Test) is preferably 500 to 2,000%, more preferably 700 to 1,500%, still more preferably 800 to 1,000%.

In using the rubber (F), the content of the rubber (F) is preferably 1 to 40 wt %, more preferably 5 to 30 wt %, still more preferably 8 to 25 wt % based on the total weight of (A) and (B).

The filler (G) includes materials used conventionally for insulators, such as silica, alumina, calcium carbonate, barium sulfate, titanium oxide, talc, etc.

In using the filler (G), the content of the filler (G) is preferably 1 to 50 wt %, more preferably 5 to 40 wt %, still more preferably 8 to 30 wt % based on the total weight of the curable resin (A) and the low molecular weight compound (B).

The curable resin composition (X1) may contain further a solvent.

The solvent may be the same as the one useful for polymerization of the curable resin (A).

The solvent used in polymerization of (A) may be kept unremoved and used in production of (X1). The solvent used in polymerization of (A) may be removed once and the same solvent used in polymerization of (A) or another solvent may be added later for production of (X1). Otherwise, a mixture of (B) and a solvent may be mixed with (A).

In using the solvent, the content of the solvent is preferably 5 to 90 wt %, more preferably 10 to 80 wt %, still more preferably 30 to 70 wt % based on the total weight of (A) (excluding the weight of the solvent) and (B).

The composition (X1) can be readily produced by mixing (A), (B), and optionally (D)–(G) and/or a solvent uniformly in a conventional manner, for example, by any of the methods (1)–(3) shown below.

(1): (A) and (B) are blended, and then (D)–(G) and/or a solvent is mixed as necessary therewith.

(2): (A) is mixed with (D)–(G) and/or a solvent as necessary, and (B) is mixed therewith.

(3): (A) and (B), and optionally (D)–(G) and/or a solvent are simultaneously mixed.

The dielectric constant after curing of the curable resin composition (X1) can be adjusted by the kind of the monomer as the source material of (A). For example, a higher content of ethylene, propylene, butadiene, isoprene, (meth) acrylate esters of 4 or more carbon atoms, styrene, or the like tends to decrease the dielectric constant, whereas a higher content of (meth)acrylic acid, acrylonitrile, etc. tends to increase the dielectric constant. The examples of the monomer mixture giving a dielectric constant of 2 to 3.5 include a mixture of styrene/glycidyl (meth)acrylate (10 to 55/90 to 45 by mass parts) and a stoichiometric ratio (equivalent ratio) of bisphenol A diglycidyl ether and 4-methylcyclohexane-1,2-dicarboxylic anhydride; a mixture of styrene/glycidyl (meth)acrylate (10 to 55/90 to 45 by mass parts), bisphenol A diglycidyl ether, and tris(hydroxyphenyl)methane; a mixture of styrene/glycidyl (meth)acrylate (10 to 55/90 to 45 by mass parts), bisphenol A diglycidyl ether, and a phenol novolak resin (2 to 8 nuclear); a mixture of styrene/glycidyl (meth)acrylate (10 to 55/90 to 45 by mass parts) and bisphenol A diglycidyl ether; a mixture of styrene/glycidyl (meth)acrylate (10 to 55/90 to 45 by mass parts) and phenol novolak polyglycidyl ether, and so forth.

Next, the curable resin composition (X2) is explained.

The α-olefin (Ha) has preferably carbon atoms of 2 to 20, more preferably 3 to 18, still more preferably 3 to 12.

The (Ha) includes ethylene, propylene, 1-butene, 3-methyl-1-butene, 1-pentene, 3-methyl-1-pentene, 4-methyl]-pentene, 1-hexene, 1-octene, 1-decene, 1-dodecene, 1-tetradecene, 1-hexadecene, 1-octadecene, 1-eicosene, etc.

The cyclic olefin (Hb) has preferably carbon-carbon double bonds of at least 2, more preferably 2 to 5, still more preferably 2 to 3 in number.

The (Hb) includes cyclic olefins (Hb1) represented by Formula (6), cyclic olelfins (Hb2) represented by Formula (7), cyclic olefins (Hb3) represented by Formula (8), and mixtures thereof.

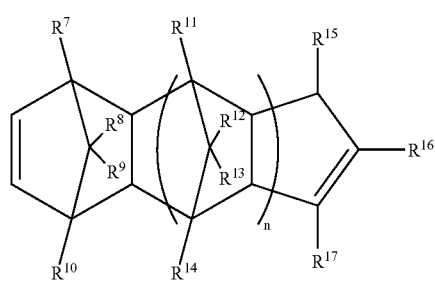

In Formula (6), $R^7$ to $R^{17}$ each independently represents a hydrogen atom or an alkyl group of 1 to 4 (preferably 1 to 2) carbon atoms.

The alkyl group includes methyl, ethyl, isopropyl, butyl, t-butyl, etc.

As the groups of $R^7$ to $R^{17}$, a hydrogen atom, a methyl group, and an ethyl group are preferable in view of the heat resistance.

The symbol n indicates an integer of 0 to 5, preferably 0 to 2 in view of mechanical strengths (tensile strength, tensile elongation, etc.).

The (Hb1) includes dicyclopentadiene (in Formula (6), n is 0, and all of the $R^7$ to $R^{17}$ groups are a hydrogen atom), tricyclopentadiene (in Formula (6), n is 1, and all of the $R^7$ to $R^{17}$ groups are a hydrogen atom), tetracyclopentadiene (in Formula (6), n is 2, and all of the $R^7$ to $R^{17}$ groups are a hydrogen atom), etc.

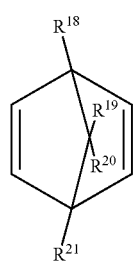

In Formula (7), $R^{18}$ to $R^{21}$ represent the same as $R^7$ to $R^{17}$ in Formula (6), and the preferred ranges are the same.

The (Hb2) includes norbornadiene, 3-methylnorbornadiene, etc.

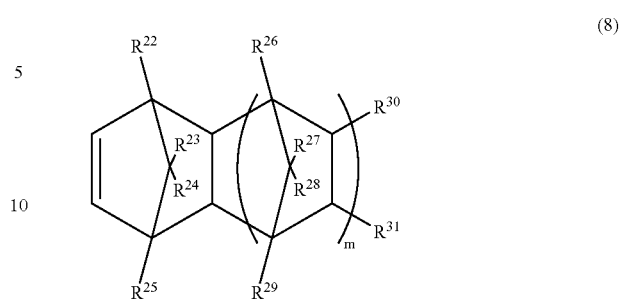

In Formula (8), $R^{22}$ to $R^{29}$ represent the same as $R^7$ to $R^{17}$ in Formula (6), and the preferred ranges are the same.

$R^{30}$ and $R^{31}$ each independently represent a hydrogen atom or a hydrocarbon group of 1 to 4 (preferably 1 to 2) carbon atoms.

The hydrocarbon group includes methyl, ethyl, isopropyl, butyl, t-butyl, ethylidene, vinylidene, etc.

As $R^{30}$ and $R^{31}$, preferable are methyl, ethyl, ethylidene, and vinylidene in view of the heat resistance.

The symbol m indicates an integer of 0 to 5, preferably 0 to 2 in view of the mechanical strengths (tensile strength, tensile elongation, etc.).

The cyclic olefin (Hb3) includes 5-ethylidene-2-norbornene, 5-vinylidene-2-norbornene, 2-ethylidene-1,4,5,8-dimethano-1,2,3,4,4a,5,8,8a-octahydronaphthalene, etc.

Of the cyclic olefins (Hb), preferable are (Hb3), more preferable are 5-ethylidene-2-norbornene, and 2-ethylidene-1,4,5,8-dimethano-1,2,3,4,4a,5,8,8a -octahydronaphthalene, particularly preferable is 5-ethylidene-2-norbornene.

The weight ratio of the α-olefin (Ha)/cyclic olefin (Hb) is preferably 99/1 to 10/90, more preferably 90/10 to 20/80, most preferably 30/70 to 60/40. Within this range, the thermal shock resistance of the resin after curing tends to be improved further.

The number of the carbon-carbon double bonds contained in the copolymer (H) is preferably 2 to 3,000, more preferably 3 to 1,000, still more preferably 5 to 500, most preferably 10 to 200.

The Mw of the copolymer (H) is preferably 3,000 to 1,000,000, more preferably 50,000 to 400,000, still more preferably 70,000 to 200,000, most preferably 80,000 to 100,000.

The (H) can readily be produced by copolymerizing (Ha) and (Hb) in the same manner as the polymerization of the curable resin (A) used for the aforementioned curable resin composition (X1).

The crosslinking agent (I) has preferably 1 to 6, more preferably 1 to 5, still more preferably 1 to 3 carbon-carbon double bonds.

As the (I), useful are (meth)acrylates, unsaturated hydrocarbons, alkenyl ethers, etc.

The (meth)acrylates include monomers (b) having only (meth)acryloyl groups, monomers (f) having an epoxy group and a (meth)acryloyl group, monomers (h) having a (meth)acryloyl group and a vinyloxy group, monomers (i) having a (meth)acryloyl group and an allyloxy group, monomers (j) having a (meth)acryloyl group and a propenyloxy group, monomers (s) having a hydroxyl group and a (meth)acryloyl group, monomers (t) having a (meth)acryloyl group and an isocyanato group, monomers (u) having a (meth)acryloyl group and a carboxyl group, alkyl (meth)acrylate esters (bb3), phenoxy group-containing (meth)acrylates, etc.

The phenoxy group-containing (meth)acrylates include phenoxyethyl (meth)acrylate, (meth)acrylate of an adduct of phenol and 2 moles of EO, (meth)acrylate of an adduct of phenol and 2 moles of EO and 2 moles of PO, etc.

The unsaturated hydrocarbons include aromatic compounds (bb2) having a polymerizable unsaturated double bond, α-olefins (Ha), aliphatic nonconjugated polyenes of 5 to 10 carbon atoms, cyclic olefins of 5 to 10 carbon atoms, and oligomers of the cyclic olefins, etc.

The aliphatic nonconjugated polyenes include 1,4-pentadiene, 1,4-hexadiene, 1,5-hexadiene, 1,6-octadiene, 2-methyl-1,5-hexadiene, 6-methyl-1,5-heptadiene, 7-methyl-1,6-octadiene, 1,3,5-octatriene, 1,4,9-decatriene, etc.

The cyclic olefins include cyclopentene, cyclohexene, 3,4-dimethylcyclopentene, 3-methylcyclohexene, 2-(2-methylbutyl)-1-cyclohexene, cyclohexadiene, cyclooctadiene, dicyclopentadiene, methyltetrahydroindene, norbornadiene, 2-propenyl-2,5-norbornadiene, norbornene, dicyclopentadiene, dimethanocyclopentadienonaphthalene, trimers and tetramers of cyclopentadiene, 2-norbornene, 5-methyl-2-norbornene, 5,5-dimethyl-2-norbornene, 5-ethyl-2-norbornene, 5-ethylidene-2-norbornene, 5-vinylidene-2-norbornene, 5-phenyl-2-norbornene, 5-phenyl-5-methyl-2-norbornene, 6-ethyl-1,4:5,8-dimethano-1,4,4a,5,6,7,8,8a-octahydronaphthalene, 2,3-cyclopentadienonaphthalene, 2-ethylidene-1,4,5,8-dimethano-1,2,3,4,4a,5,8,8a-octahydronaphthalene, 1,4:5,10:6,9-trimethano-1,2,3,4,4a,5,5a,6,9,9a,10,10a-dodecahydro-2,3-cyclopentadienoanthracene, etc.

The oligomers of cyclic olefins include 3 to 4 mers of cyclopentadiene, cyclopentediene oligomers (2 to 30 mers), 5-ethylidene-2-norbornene oligomers (2 to 30 mers), etc.

As the alkenyl ethers, useful are vinyl ethers of 4 to 10 carbon atoms, propenyl ethers of 5 to 12 carbon atoms, allyl ethers of 5 to 12 carbon atoms.

The vinyl ethers include ethylene glycol divinyl ethers, diethylene glycol divinyl ethers, triethylene glycol divinyl ethers, tetraethylene glycol divinyl ethers, propylene glycol divinyl ethers, dipropylene glycol divinyl ethers, butylene glycol divinyl ethers, etc.

The propenyl ethers include ethylene glycol dipropenyl ether, diethylene glycol dipropenyl ether, triethylene glycol dipropenyl ether, tetraethylene glycol dipropenyl ether, propylene glycol dipropenyl ether, dipropylene glycol dipropenyl ether, butylene glycol dipropenyl ether, etc.

The allyl ethers include ethylene glycol diallyl ether, diethylene glycol diallyl ether, triethylene glycol diallyl ether, tetraethylene glycol diallyl ether, propylene glycol diallyl ether, dipropylene glycol diallyl ether, butylene glycol diallyl ether, etc.

The aforementioned crosslinking agent (I) preferably does not contain a polar group in the molecule in view of the dielectric constant. As the crosslinking agent, in view of the reactivity and the dielectric constant, preferable are α-olefins, cyclic olefins, cyclic olefin oligomers, vinyl ethers, propenyl ethers, and allyl ethers, more preferable are cyclic olefins, cyclic olefin oligomers, vinyl ethers, propenyl ethers, and allyl ethers, particularly preferable are propenyl ethers.

The boiling point of the crosslinking agent (I) is preferably 250° C. or higher, more preferably 250 to 350° C., still more preferably 280 to 300° C.

The crosslinking agent (I) may be used singly or in combination of two or more thereof.

Incidentally, since the copolymer (H) has itself at least one carbon-carbon double bond, the part of the copolymer can serve a crosslinking agent to cause reaction between the copolymers (H). However, an additional crosslinking agent (I) is preferably used in view of the physical properties such as heat resistance.

The weight ratio of the copolymer (H)/crosslinking agent (I) is preferably 99/1 to 20/80, more preferably 90/10 to 40/60, still more preferably 85/15 to 50/50.

Within this range, the heat resistance tends to be improved further owing to sufficient crosslinking.

The aforementioned curable resin composition (X2) may contain the other additive (D), the other resin (E), a rubber (F), a filler (G), etc.

In using (D), the content of (D) is preferably 0.001 to 3.0 wt %, more preferably 0.01 to 2.0 wt %, still more preferably 0.05 to 1.0 wt % based on the total weight of (H) and (I).

In using the other resin (E), the content of (E) is preferably 1 to 45 wt %, more preferably 5 to 40 wt %, still more preferably 10 to 30 wt % based on the total weight of the copolymer (H) and the crosslinking agent (I).

In using the rubber (F), the content of (F) is preferably 1 to 40 wt %, more preferably 5 to 30 wt %, still more preferably 8 to 25 wt % based on the total weight of (H) and (I).

In using the filler (G), the content of (G) is preferably 1 to 50 wt %, more preferably 5 to 40 wt %, still more preferably 8 to 30 wt % based on the total weight of (H) and (I).

The curable resin composition (X2) may further contain a solvent.

The solvent may be the same as the one useful for polymerization of the curable resin (A).

In using the solvent, the content of the solvent is preferably 5 to 90 wt %, more preferably 10 to 80 wt %, still more preferably 30 to 70 wt % based on the total weight of (H)(excluding the weight of the solvent) and (I).

The curable resin composition (X2) can readily be produced by mixing (H), (I), and optionally (D)–(G) and/or a solvent uniformly in a conventional manner, for example, by any of the methods (1)–(3) shown below.

(1): (H) and (I) are blended, and then (D)–(G) and/or a solvent is optionally mixed therewith.

(2): (H) is blended with (D)–(G) and/or a solvent as necessary, and (I) is mixed therewith.

(3): (H) and (I), and optionally (D)–(G) and/or a solvent are simultaneously mixed.

The dielectric constant after curing of the curable resin composition (X2) can be adjusted by the kind of the crosslinking agent (I). For example, a higher content of the α-olefin, cyclic olefin, cyclic olefin oligomer, or the like tends to decrease the dielectric constant, whereas a higher content of the (meth)acrylate, alkenyl ether or the like tends to increase the dielectric constant.

The examples of the composition giving a dielectric constant of 2 to 3.5 are a mixture of a 1-hexene/5-ethylidene-2-norbornene copolymer and ethylene glycol diallyl ether, a mixture of 1-hexene/5-ethylidene-2-norbornene copolymer and ethylene glycol dimethacrylate, a mixture of 1-hexene/dicyclopentadiene copolymer and ethylene glycol diallyl ether, a mixture of 1-hexene/dicyclopentadiene copolymer and ethylene glycol dimethacrylate, etc.

Next, the curable resin composition (X3) is explained.

The monomers (345) represented by formulas (3)–(5) are explained below.

In Formula (3), n is an integer of preferably 2 to 6, more preferably 2 to 4.

The monomers represented by Formula (3) include perfluoromethyl perfluorovinyl ether, perfluoroethyl perfluorovinyl ether, perfluoropropyl perfluorovinyl ether, perfluoroisobutyl perfluorovinyl ether, perfluorohexyl perfluorovinyl ether, perfluorodecyl perfluorovinyl ether, etc.

Of these monomers, in view of the thermal resistance, preferable are perfluoromethyl perfluorovinyl ether, perfluoroethyl perfluorovinyl ether, perfluoropropyl perfluorovinyl ether, perfluoroisobutyl perfluorovinyl ether, and perfluorohexyl perfluorovinyl ether, more preferable are perfluoromethyl perfluorovinyl ether, perfluoroethyl perfluorovinyl ether, perfluoropropyl perfluorovinyl ether, and perfluoroisobutyl perfluorovinyl ether.

In Formula (4), m is an integer of preferably 0 to 4, more preferably 0 to 2.

The symbol n is an integer of preferably 2 to 6, more preferably 2 to 4.

The monomers represented by Formula (4) include perfluoromethyl (meth)acrylate, perfluoroethyl (meth)acrylate, perfluoropropyl (meth)acrylate, perfluoroisobutyl (meth)acrylate, perfluorohexyl (meth)acrylate, tridecafluorohexyl (meth)acrylate, perfluorodecyl (meth)acrylate, perfluoropropylmethyl (meth)acrylate, perfluoroisobutylethyl (meth)acrylate, perfluoromethylbutyl (meth)acrylate, perfluoroethylhexyl (meth)acrylate, etc.

Of these monomers, in view of the dielectric constant, preferred are perfluoroethyl (meth)acrylate, perfluoropropyl (meth)acrylate, perfluoroisobutyl (meth)acrylate, perfluorohexyl (meth)acrylate, perfluoropropylmethyl (meth)acrylate, perfluoroisobutylethyl (meth)acrylate, perfluoromethylbutyl (meth)acrylate, and perfluoroethylhexyl (meth)acrylate, more preferable is perfluoroethyl (meth)acrylate.

In Formula (5), $R^3$ and $R^4$ are preferably a fluorine atom respectively, and $R^5$ is preferably a fluorine atom or a trifluoromethyl group.

The monomers represented by Formula (5) include vinyl fluoride, vinylidene fluoride, chlorotrifluoroethylene, dichlorodifluoroethylene, tetrafluoroethylene, hexafluoropropylene, etc.

Of these, in view of the dielectric constant, preferable are vinyl fluoride, vinylidene fluoride, tetrafluoroethylene, and hexafluoropropylene, still more preferable are tetrafluoroethylene, and hexafluoropropylene.

For the curable resin composition (X3), of the monomers (fgw), (f) and (g) are preferable. In (X3), of the monomers (bb235), the monomers (bb2) are preferable; in view of the dielectric constant and the thermal resistance, more preferable are styrene, o-methylstyrene, p-methylstyrene, o-fluorostyrene, m-fluorostyrene, p-fluorostyrene, 2,6-difluorostyrene, and 2,3,4,5,6-pentafluorostyrene.

The curable resin composition (X3) comprises a copolymer (J) formed from at least one monomer selected from the monomers (fgw), at least one of a monomer (345), and optionally at least one monomer selected from the monomers (bb235).

In other words, (X3) may be a binary copolymer formed from combination of at least one monomer selected from the monomers (fgw), any one of the monomers (345), and optionally at least one monomer selected from (bb235); or may be a polygenetic copolymer formed from combination of at least one monomer selected from the monomers (fgw), two or more of the monomers (345), and optionally at least one monomer selected from (bb235). These binary copolymers and polygenetic copolymers are referred to collectively and simply as copolymers (J).

As the copolymer (J), polygenetic copolymers are preferable in view of the dielectric constant, the thermal resistance and workability; more preferable are polymers having (f) and/or (g) as the essential constituting monomer unit; still more preferable are polymers having (f) and/or (g), and a monomer (4) as the essential constituting monomer units; still more preferable are polymers formed from (f) and/or (g), a monomer (4), and optionally (bb2), (bb3), and/or (bb5), polymers formed from (f) and/or (g), monomers (3) and (4), and optionally (bb2), (bb3), and/or (bb5), polymers formed from (f) and/or (g), monomers (4) and (5), and optionally (bb2), (bb3), and/or (bb5); still more preferable are polymers formed from (f) and/or (g), a monomer (4), and (bb2), polymers formed from (f) and/or (g), monomers (3) and (4), and (bb2), and polymers formed from (f) and/or (g), monomers (4) and (5), and optionally (bb2).

The weight ratio of the monomer (fgw)/monomer (345) is preferably 5/95 to 95/5, more preferably 20/80 to 70/30, still more preferably 30/70 to 60/40.

In the case of the polygenetic copolymers, a higher weight ratio of the monomer (345) is preferable. When the monomer (bb235) is used, the weight ratio of the monomer (fgw)/monomer (bb235) is preferably 10/90 to 95/5, more preferably 30/70 to 90/10, still more preferably 40/60 to 80/20.

The bonding type of the copolymer (J) may be a block type, a random type or a combination thereof.

The total number of epoxy groups and alkenyl ether groups in the copolymer (J) is preferably 2 to 3,000, more preferably 3 to 1,000, still more preferably 5 to 500, still more preferably 10 to 200.

The Mw of (J) is preferably 2,000 to 1,000,000, more preferably 3,000 to 700,000, still more preferably 50,000 to 400,000.

The (J) can readily be produced by copolymerizing a monomer (fgw) and a monomer (345), and optionally a monomer (bb235) in the same manner as the polymerization of the (A) used for the aforementioned (X1).

The composition (X3) may contain the other additive (D), the other resin (E), a rubber (F), a filler (G), etc.

In using (D), the content of (D) is preferably 0.001 to 3.0 wt %, more preferably 0.01 to 2.0 wt %, still more preferably 0.05 to 1.0 wt % based on the weight of (J).

In using (E), the content of (E) is preferably 1 to 45 wt %, more preferably 5 to 40 wt %, still more preferably 10 to 30 wt % based on the weight of the copolymer (J).

In using (F), the content of (F) is preferably 1 to 40 wt %, more preferably 5 to 30 wt %, still more preferably 8 to 25 wt % based on the weight of the copolymer (J).

In using (G), the content of (G) is preferably 1 to 50 wt %, more preferably 5 to 40 wt %, still more preferably 8 to 30 wt % based on the weight of the copolymer (J).

The curable resin composition (X3) may contain further a solvent.

The solvent may be the same as the one useful for polymerization of the curable resin (A).

In using the solvent, the content of the solvent is preferably 5 to 90 wt %, more preferably 10 to 80 wt %, still more preferably 30 to 70 wt % based on the weight of the copolymer (J).

The composition (X3) can be readily produced by mixing (J), and optionally (D)–(G) and/or a solvent uniformly in a conventional manner, for example, by any of the methods (1)–(3) shown below.

(1): To the copolymer (J), (D)–(G) and/or a solvent is added and mixed successively.

(2): The copolymer (J) is mixed with a solvent, and (D)–(G) are mixed optionally.

(3): The copolymer and optionally (D)–(G) and/or a solvent are simultaneously mixed.

The dielectric constant of the curable resin composition (X3) after curing can be adjusted by the kinds of the monomer (ggw), the monomer (345), and the monomer (bb235). For example, a higher content of (f), (g), and (bb2) tends to increase the dielectric constant.

The examples of the composition giving a dielectric constant of 2 to 3.5 are styrene/propenoxyethyl methacrylate copolymers (weight ratio: 45 to 90/55 to 19), styrene/propenoxyethyl methacrylate/2-ethylhexyl acrylate copolymers (weight ratio: 44 to 80/55 to 10/1 to 10), etc.

Next, the thermoplastic resin (Y) is explained.

The dielectric constant of the thermoplastic resin (Y) is preferably not higher than 3.0; more preferably 1.9 to 2.8; still more preferably 2.0 to 2.6; still more preferably 2.0 to 2.5; most preferably 2.1 to 2.3. Within such a range of the dielectric constant, the resulting resin has higher reliability for use as an insulator, and tends to facilitate, in application to an electronic integrated wiring or the like, improvement of a wiring performance with less delay of signals.

The curing conditions and the method for measuring the dielectric constant are the same as those for the curable resin (A).

The content of the carbon-carbon double bond or the carbon-nitrogen bond in the thermoplastic resin (Y) per gram of (Y) is preferably $5\times10^{-5}$ to $3.5\times10^{-2}$ mol/g; more preferably $1.0\times10^{-4}$ to $3.5\times10^{-2}$ mol/g for the carbon-carbon double bonds and $1\times10^{-4}$ to $3.5\times10^{-2}$ mol/g for the carbon-nitrogen bonds; and in particular in view of the dielectric constant, still more preferably $1.0\times10^{-3}$ to $2.5\times10^{-2}$ mol/g for the carbon-carbon double bonds, and $5\times10^{-4}$ to $2.5\times10^{-2}$ mol/g for the carbon-nitrogen bond.

At a lower content of the carbon-carbon double bond or carbon-nitrogen bond than the above range, the thermoplastic resin on the surface of the insulation layer is not readily melted out and tends to be not capable of forming fine surface roughness and tends to deteriorate the adhesiveness of electroless plating. On the other hand, at a higher content thereof, the dielectric constant of the curable resin material tends to deteriorate.

The carbon-carbon double bonds or the carbon-nitrogen bonds in (Y) may be present either in the main chain skeleton or the side chain skeleton of the resin, but is preferably present in the main chain skeleton of the resin.

As the thermoplastic resin (Y), useful are thermoplastic resins (Y1) having a carbon-carbon double bond, thermoplastic resins (Y2) having a carbon-nitrogen bond, etc.

The thermoplastic resins (Y1) include (co)polymers having essentially constituting monomer units of (b1), (b3), (c), (d1), (d3), (e1), and/or (e3).

The copolymer of the above resin may be of a random type or of a block type.

The thermoplastic resin (Y1) may contain, in addition to the essential constituting monomer units, an additional comonomer.

The additional comonomer includes (b2), (b4), (d2), (d4), (d5), (d6), (e2), (e4), (e5), (e6), (f), (g), (h), (i), (j), (q), (r), (s), (t), (u), (v), (w), (bb), etc.

In using the additional comonomer, the content of the additional comonomer is not specially limited, but is preferably 20 to 80 wt %, more preferably 35 to 70 wt %, still more preferably 50 to 60 wt % based in the total weight of the used monomers in view of the thermal resistance and the resin strength.

The (Y1) can readily be produced in the same manner as polymerization of (A) for use for (X1).

The thermoplastic resin (Y1) includes polybutadiene, polyisoprene, styrene-butadiene copolymers, styrene-isoprene copolymers, acrylonitrile-butadiene copolymers, ring-opened norbornene polymer, etc. These resins are readily available commercially.

The commercial products (trade names) include polybutadiene such as JSR BR series (produced by JSR), polyisoprene such as JSR IR series (produced by JSR), styrene-butadiene copolymers such as JSR TR series (produced by JSR), styrene-isoprene copolymers such as JSR SIS series (produced by JSR), ring-opened norbornene polymers such as NORSOREX series (produced by JSR), etc.

The thermoplastic resins (Y2) having a carbon-nitrogen bond include polyamides, polyurethanes, polyureas, polyimides, polyamino acids, reaction products of a bifunctional epoxy compound and a monofunctional primary amine.

The polyamides include reaction products of a diamine of 2 to 18 carbon atoms and a dicarboxylic acid of 6 to 20 or more carbon atoms.

The diamines include diamines in the monomer groups (k) and (m).

The dicarboxylic acids include dicarboxylic acids in the monomer group (n).

In the reaction for producing the polyamide, for controlling the molecular weight, there may be used a compound of (k) or (m) other than the diamines, (aa7), or (aa8), or a compound of (n) other than the dicarboxylic acids, (aa3), or (aa4).

The polyurethanes useful are produced by reaction of a dihydric phenol or dihydric alcohol of 2 to 100 or more carbon atoms with a diisocyanate of 6 to 20 carbon atoms.

The dihydric phenols include the compounds (o1), etc., and the dihydric alcohols include the compounds (o3), etc.

The isocyanates include isocyanates in the (p), etc.

In the reaction for producing the polyurethane, for controlling the molecular weight, there may be used a compound of (o2), (o4), or (p) other than diisocyanates.

The polyureas include reaction products of a diamine of 2 to 18 carbon atoms, and a diisocyanate of 6 to 20 carbon atoms.

The diamines include those in the compounds (k) and (m), etc.

The isocyanates include those in the compounds (p), etc.

In the reaction for producing the polyurea, for controlling the molecular weight, there may be used a compound of (k) or (m) other than the diamines, a compound of (aa7), (aa8), or (p) other than diisocyanates, or the like.

The polyimides include reaction products produced by reaction of a diamine of 2 to 18 carbon atoms and polycarboxylic acid of 6 to 20 carbon atoms.

The diamines include the diamines in the compounds (k) and (m).

The polycarboxylic acids include those of (n).

In the reaction for producing the polyimide, for controlling the molecular weight, there may be used a compound of (k) or (m) other than the diamines, a compound of (aa7), (aa8), (aa3), (aa4), or the like.

The polyamino acids include condensate of an aminocarboxylic acid of 2 to 12 carbon atoms, ring-opening polymerization products of lactams of 6 to 12 carbon atoms, etc.

The aminocarboxylic acids include amino acids (glycine, alanine, valine, leucine, isoleucine, phenylalanine, etc.), ω-amino-caproic acid, ω-amino-enanthic acid, ω-amino-caprylic acid, ω-amino-pelargonic acid, ω-amino-capric acid, 11-amino-undecanoic acid, 12-amino-dodecanoic acid, etc.

The lactams include caprolactam, enantholactam, laurolactam, undecanolactam, etc.

In the reaction for producing the polyamino acid, for controlling the molecular weight, there may be used also a compound of (k), (m), (aa7), (aa8), (n), (aa3), (aa4), or the like.

The bifunctional epoxy compounds include bifunctional glycidyl esters in the compounds of (a11), (a13), and (a2); bifunctional glycidylamine in the compounds of (a3); bifunctional epoxides in the compounds of (a4); etc.

The monofunctional primary amines include the primary amines in the compounds (aa7) and (aa8), etc.

In the reaction of the bifunctional epoxy compound and the monofunctional primary amine, for controlling the molecular weight, there may be used a compound of (a), (k), (m), (n), (p), (p), or the like.

The resin (Y2) can readily be produced in the same manner as polymerization of (A) for use for (X1).

Of the resins (Y), in view of the dielectric constant, preferable are (Y1) resins, and reaction products of a bifunctional epoxy compound and a monofunctional primary amine; more preferable are polybutadiene, polyisoprene, styrene-butadiene copolymers, styrene-isoprene copolymers, ring-opened norbornene polymers, and reaction products of a bifunctional epoxy compound and a monofunctional amine.

The resin (Y) may contain the other additive (D), the other resin (E), a rubber (F), a filler (G), etc.

In using (D), the content of (D) is preferably 0.001 to 3.0 wt %, more preferably 0.01 to 2.0 wt %, still more preferably 0.05 to 1.0 wt % based on the weight of (Y).

In using (E), the content of (E) is preferably 1 to 45 wt %, more preferably 5 to 40 wt %, still more preferably 10 to 30 wt % based on the weight of (Y).

In using (F), the content of (F) is preferably 1 to 40 wt %, more preferably 5 to 30 wt %, still more preferably 8 to 25 wt % based on the weight of (Y).

In using (G), the content of (G) is preferably 1 to 50 wt %, more preferably 5 to 40 wt %, still more preferably 8 to 30 wt % based on the weight of (Y).

The (Y) may contain a solvent.

The solvent may be the same as the one useful for polymerization of the curable resin (A).

In using the solvent, the content of the solvent is preferably 5 to 90 wt %, more preferably 10 to 80 wt %, still more preferably 30 to 70 wt % based on the weight of (Y).

The (Y) can readily be produced by uniform mixing, optionally with (D)–(G) and/or a solvent in a conventional method.

The dielectric constant of (Y) can be controlled, in the case of (Y1), by adjusting the amounts of the source materials of (Y1). For example, a higher content of butadiene, etc. tends to lower the dielectric constant, whereas a higher content of styrene, etc. tends to raise the dielectric constant.

In the case of (Y2), the amounts of the source materials of (Y2) are adjusted. For example, use of a diamine, a dicarboxylic acid, and a monoalkylamine, etc. having a relatively large number of carbon atoms tends to lower the dielectric constant, whereas use of a diamine, a dicarboxylic acid, and a monoalkylamine, etc. having a relatively small number of carbon atoms tends to raise the dielectric constant.

The dielectric constant of 2 to 3.5 of the curable resin material can be obtained, for example, by styrene/butadiene copolymers, styrene/butadiene/acrylonitrile copolymers, bisphenol A/monododecylamine copolymers, and so forth.

The weight ratio of (X)/(Y) in a solvent-free state (in terms of pure components) is preferably 40 to 98/2 to 60, more preferably 65 to 96/4 to 35 in view of the resin strength, and still more preferably 70 to 90/10 to 30 in view of the thermal resistance, most preferably 80 to 85/15 to 20.

The curable resin material of the present invention may contain a curing catalyst (C), as necessary.

The catalyst (C) may be added immediately before use of the curable resin material of the present invention, or may be added during production of the curable resin material of the present invention.

In using (C), the content of (C) (excluding the ones used in preparation of (A), (X1), (X2), and (X3)) is preferably 0.001 to 10 wt %, more preferably 0.01 to 8.0 wt %, still more preferably 0.05 to 5.0 wt %, most preferably 0.1 to 2.0 wt % based on the weight of (X) and (Y).

The curable resin material of the present invention may contain the other additive (D), the other resin (E), a rubber (F), a filler (G), etc.

In using the other additive (D), the content of (D) is preferably 0.001 to 3.0 wt %, more preferably 0.01 to 2.0 wt %, still more preferably 0.05 to 1.0 wt % based on the weight of (X) and (Y).

In using the other resin (E), the content of (E) is preferably 1 to 45 wt %, more preferably 5 to 40 wt %, still more preferably 10 to 30 wt % based on the total weight of (X) and (Y).

In using the rubber (F), the content of (F) is preferably 1 to 40 wt %, more preferably 5 to 30 wt %, still more preferably 8 to 25 wt % based on the weight of (X) and (Y).

In using the filler (G), the content of (G) is preferably 1 to 50 wt %, more preferably 5 to 40 wt %, still more preferably 8 to 30 wt % based on the weight of (X) and (Y).

The curable resin material of the present invention may contain a solvent.

The solvent may be the same as the one useful for polymerization of (A).

In using the solvent, the content of the solvent is preferably 5 to 90 wt %, more preferably 10 to 80 wt %, still more preferably 30 to 70 wt % based on the weight of (X) and (Y).

The curable resin material of the present invention comprises (X) and (Y). (Y) is preferably distributed uniformly in (X), or (Y) is preferably dispersed uniformly in (X).

In the case where (Y) is dispersed in (X), the average diameter of the dispersed particles is not limited, but is preferably 0.001 to 50 μm, more preferably 0.005 to 20 μm in view of the resin strength, still more preferably 0.01 to 10 μm, still more preferably 0.05 to 5 μm in view of the adhesion properties, most preferably 0.1 to 2 μm.

The average diameter of the dispersed particles is derived by curing the curable resin material at 180° C. for 3 hours, observing the cross section thereof by scanning electron microscopy, and averaging arithmetically the particle diameters of at least 10 particles of (Y).

The curable resin material of the present invention is a uniform mixture of (X), and (Y), and optionally (C)–(G) and/or a solvent, and can be produced readily by a conventional process, for example by any of the process below.

(1): (X) and (Y), and as necessary, (C)–(G) are dissolved uniformly in a solvent, and the solvent is removed by a suitable method.

(2): (Y), and as necessary, (C)–(G) are dissolved uniformly in a solvent; (X) is allowed to polymerize in this solution; and the solvent is removed by a suitable method.

(3): (A), (B) and (Y), and as necessary, (C)–(G) are dissolved uniformly in a solvent, and the solvent is removed by a suitable method.

(4): (H), (I) and (Y), and as necessary, (C)–(G) are dissolved uniformly in a solvent, and the solvent is removed by a suitable method.

The solvent is not limited provided that the solvent is capable of dissolving both of the resins. For example, the solvent for production of (A) is useful.

In the steps of dissolution, polymerization, and solvent removal, a special operation is not necessary, but stirring is preferably conducted at 1,000 to 20,000 rpm.

The curable resin material may be in any state, for example, in a liquid state (including a solution state), or in a film state (including a plate state and a sheet state). The film thickness is preferably 1 to 100 µm, more preferably 5 to 60 µm, still more preferably 15 to 50 µm.

(3) Fourth of Present Invention:

The curable film of the present invention after curing has a tensile modulus of 100 to 250 Kgf/mm$^2$, preferably 110 to 240 Kgf/mm$^2$, more preferably 120 to 230 Kgf/mm$^2$, still more preferably 130 to 220 Kgf/mm$^2$, still more preferably 140 to 210 Kgf/mm$^2$, most preferably 150 to 200 Kgf/mm$^2$. Within this range of the tensile modulus, an insulating material having high thermal shock resistance and other excellent properties can readily be obtained.

The tensile modulus is measured according to JIS K7113 (1995).

The curable film after curing has a dielectric constant of not higher than 3.5, preferably 1.9 to 3.5, more preferably 2.0 to 3.4, still more preferably 2.0 to 3.3, still more preferably 2.1 to 3.3, most preferably 2.1 to 3.2.

The curing conditions of the curable film are the same as the curing conditions in the dielectric constant measurement.

The composition constituting the curable film of the present invention contains a curable polymer compound.

The Mw of the curable polymer compound is 10,000 to 1,000,000, preferably 20,000 to 500,000, more preferably 30,000 to 100,000, still more preferably 40,000 to 500,000, still more preferably 50,000 to 200,000, most preferably 60,000 to 100,000. Within this range of the Mw, an insulating material having high thermal shock resistance and other excellent properties can readily be obtained.

As the curable polymer compound, useful are curable resins (A), and curable resin compositions (X1), (X2), and (X3).

As the composition constituting the curable film of the present invention, useful are the above curable resin materials, etc., most preferably the curable resin material containing (X1).

The thickness of the curable film of the present invention may be decided suitably to meet the use thereof, but is preferably 1 to 100 µm, more preferably 5 to 70 µm, still more preferably 15 to 60 µm, still more preferably 20 to 50 µm.

The curable film of the present invention can be produced by molding the composition (e.g., aforementioned curable resin material) by a conventional molding process such as application of the composition onto a supporting medium, a substrate, or the like by using a curtain coater, a knife coater, a spray gun, a roll coater, a pin coater, a dispenser, a bar coater, a screen printer, or the like; by a dipping method; an injection-molding method; and the like method.

Among the above molding process, preferable are the methods employing a curtain coater, a knife coater, a spray gun, or a roll coater, more preferable are the methods employing a curtain coater or a knife coater, still more preferable is the method employing a knife coater.

In formation of the film, the viscosity may be adjusted as necessary by use of a solvent, or the like.

The solvent is not limited specially provided that the solvent is capable of dissolving, emulsifying, or dispersing the composition. For example, the solvent for production of the curable resin (A) is useful.

As the aforementioned supporting medium, useful are materials used conventionally for film formation, such as PET (polyethylene terephthalate), polyethylene, polypropylene, and modified materials thereof, etc.

The substrate may be a printed wiring board having a conduction wiring (copper, gold, silver, aluminum, etc.), etc. For example, a substrate-preparing resin (e.g., epoxy resins, bismaleimide-triazine resins (BT), polyamides resins, etc.) is impregnated into a nonwoven fabric (glass fiber nonwoven fabric, aramide fiber nonwoven fabric, etc.), etc., or glass fiber is added to a substrate-preparing resin, and the resin is cured and a copper wiring is allowed to adhere thereon (e.g., BT substrates, glass epoxy substrates, paper-phenol substrates, paper-epoxy substrates, etc.), etc.

In the case where a supporting medium is employed, a film on the supporting medium may be transferred onto a substrate or the like. In the case where base member is used, the film thereon is cured as it is.

The composition after application is preferably heated to remove the solvent, etc. The heating is conducted at a temperature of 10 to 150° C. (preferably 20 to 200° C.) for a time of 1 to 60 minutes (preferably 2 to 40 minutes).

The curable film of the present invention can be softened readily by heating (by hot-pressing, etc.) to penetrate into fine portions (fine concave, etc.) of the substrate, having excellent workability.

(4) Fifth of Present Invention:

The insulator of the present invention has a tensile modulus of 100 to 250 Kgf/mm$^2$, preferably 110 to 240 Kgf/mm$^2$, more preferably 120 to 230 Kgf/mm$^2$, still more preferably 130 to 220 Kgf/mm$^2$, still more preferably 140 to 210 Kgf/mm$^2$, most preferably 150 to 200 Kgf/mm$^2$. Within this range of the tensile modulus, the insulator has high thermal shock resistance.

The tensile modulus is measured according to JIS K7113 (1995).

The thermal expansion coefficient (a1) of the insulator of the present invention is 30 to 50 ppm, preferably 31 to 49 ppm, more preferably 32 to 48 ppm, still more preferably 35 to 47 ppm, still more preferably 38 to 46 ppm, most preferably 40 to 45 ppm. Within this range of the thermal expansion coefficient, the insulator has high thermal shock resistance.

The thermal expansion coefficient is measured by a tension loading method of TMA (differential expansion system). Specifically, a cured film of 40 µm thick is cut into a size of 20 mm×2 mm; the film is heated with a load of 5 g at a rate of 10° C./minute from room temperature (about 25° C.) up to 250° C.; and the length change ratio of the sample in the temperature change from 30° C. to 100° C. is measured.

The dielectric constant of the insulator of the present invention is preferably not higher than 3.5, more preferably 1.9 to 3.5, still more preferably 2.0 to 3.4, still more preferably 2.0 to 3.3, still more preferably 2.1 to 3.3, most preferably 2.1 to 3.2.

The insulator of the present invention can be produced readily by thermally curing the above curable resin (A), curable resin composition, curable resin material, curable film, etc.

The conditions of the curing are 80 to 250° C. (preferably 120 to 200° C., more preferably 150 to 200° C.), and 0.1 to 15 hours (preferably 0.2 to 5 hours, more preferably 0.5 to 2.0 hours), and so forth.

The boiling water absorption percentage of the insulator of the present invention is 3.00 to 0.001%, preferably 2.50 to 0.005%, still more preferably 2.00 to 0.01%, still more preferably 1.0 to 0.05%.

The boiling water absorption percentage is measured according to JIS K7209 (2000) 6.3B.

The volume resistivity of the insulator of the present invention is $10^{10}$ to $10^{19}$ Ω/cm, preferably $10^{12}$ to $5 \times 10^{18}$ Ω/cm, more preferably $10^{14}$ to $10^{18}$ Ω/cm, still more preferably $10^{16}$ to $5 \times 10^{17}$ Ω/cm. This insulator is superior in insulation performance to conventional insulating materials such as epoxy resins and polyimide resins.

The volume resistivity is measured according to JIS K6011 (1995).

The insulator of the present invention exhibits excellent adhesiveness to copper formed by oxidant-treatment and electroless plating, having a peeling strength (JIS C6481 (1995) 5.7) of not lower than 0.8 Kgf/cm.

Yet the thermal resistance is comparable to that of conventional insulators, not causing sagging, collapse, blistering, or other abnormalities of the pattern even by contact with solder at 300° C. and having excellent chemical resistance against solvents.

The insulating material is also excellent in 10%-sulfuric acid resistance, 10%-hydrochloric acid resistance, and 10%-sodium hydroxide resistance as measured by JIS K6911 (1995) 5.32.

Accordingly, the insulator of the present invention has high merits for speed-up and density-increase of electronic circuits.

The curable resin (A), curable resin composition, curable resin material, curable film, and insulator of the present invention are useful widely as insulators, being useful as overcoating materials, interlayer insulating materials, printed circuit boards, etc., especially as overcoating materials, and interlayer insulating materials.

The insulators are the most suitable as overcoating materials and interlayer insulating materials of electronic elements (semiconductor elements, light-emitting diodes, memories, etc.), hybrid ICs, MCMs, electric wiring boards, display parts, etc.

In one method of using the curable resin (A), curable resin composition, curable resin material, or curable film of the present invention, for example, as layer insulating material, the curable resin (A), curable resin composition, or curable resin material is applied on a substrate, or the curable film of the present invention is stuck to a substrate, then is subjected to hot pressing, and, as necessary, working for boring, etc. (roughening, conductive circuit formation, etc.). Thereto, another substrate is stuck. The above operation is repeated, and finally the piled matter is thermally cured to prepare multi-layered product.

For using the curable resin (A), curable resin composition, curable resin material, or curable film of the present invention as a part of a base member of a multilayered substrate, the curable resin (A), curable resin composition, or curable resin material of the present invention is applied on a substrate, or the curable film of the present invention is stuck to a substrate, then is subjected to hot pressing, and, as necessary, working for boring, etc. The above operation is repeated, and finally the piled matter is thermally cured to prepare multi-layered product.

The above materials may be used as a printed wiring board without using the substrate.

For use as a layer insulating material of multi-layered wiring boards of electronic circuits, the one layer insulating layer may be one-layered or multi-layered, and the layer thickness (after curing) is preferably 1-100 μm, more preferably 15 to 50 μm.

The preferred hot pressing conditions are temperature 25 to 180° C. (preferably 50 to 150° C.), pressure 0.01 MPa to 10 MPa (Preferably 0.1 to 1 MPa), time 1 to 1200 seconds (preferably 10 to 300 seconds).

Holes (via holes and through holes) for conduction between layers of the multilayered substrate can be formed by a conventional manner, for example, by use of laser (carbon dioxide gas, YAG, excimer, etc.) or drill, etc.

Roughening can be conducted by a conventional manner, for example by a method disclosed in Examined Japanese Patent Publication No. 6-49852, etc.

The conduction circuit can be formed by a conventional manner, for example by sputtering or an electroless method.

EXAMPLES

The present invention is described in more detail by reference to Examples without limiting the invention. Hereinafter, the unit "parts" means parts by weight, and "%" means percent by weight.

Synthesis Example 1

Into a reaction vessel having been purged with nitrogen, was placed 50 parts of methyl ethyl ketone, and was heated to 80° C. In another vessel having been purged with nitrogen, were mixed and dissolved uniformly 200 parts of glycidyl methacrylate, 200 parts of styrene, 200 parts of methyl ethyl ketone, 170 parts of styrene/butadiene/styrene block copolymer (Y1①) (trade name TR2250, produced by JSR (styrene/butadiene weight ratio=52/48, Mw=90,000, carbon-carbon bond concentration $8.9 \times 10^{-3}$ mol/g)), and 1.5 parts of azobisisobutyronitrile. This mixture was added dropwise into the reaction vessel in 4 hours.

After completion of the dropping addition, the mixture was allowed to age at 100° C. for 4 hours to obtain a curable resin material ((①)) comprising a styrene/glycidyl methacrylate copolymer (styrene/glycidyl methacrylate weight ratio=50/50, curable resin (A①) containing the styrene/butadiene/styrene block copolymer (Y1①) dispersed therein.

(A①) had an Mw of 220,000, a number-average molecular weight (hereinafter referred to as Mn) of 90,000 according to GPC, and an epoxy equivalent of 246. From the Mn and the epoxy equivalent, the number of crosslinking functional groups of (A①) was estimated to be 365.

(①) was dissolved in methyl ethyl ketone to obtain a solution of a solid matter content of 40% to prepare a curable resin material solution ((①)S).

Synthesis Example 2

A curable resin material ((②)) was prepared in the same manner as in Synthesis Example 1 except that 232 parts of glycidyl methacrylate and 168 parts of styrene were used in place of 200 parts of glycidyl methacrylate and 200 parts of styrene used in Example 1, the produced curable resin material comprising a styrene/glycidyl methacrylate copolymer (styrene/glycidyl methacrylate weight ratio=42/58, curable resin (A②)) containing the styrene/butadiene/styrene block copolymer dispersed therein.

(A②) had an Mw of 210,000, Mn of 88,000, and an epoxy equivalent of 180. From the Mn and the epoxy equivalent, the number of crosslinking functional groups of (A②) was estimated to be 489.

(②) was dissolved in methyl ethyl ketone to obtain a solution of a solid matter content of 40% to prepare a curable resin material solution (②S)

Synthesis Example 3

The polymerization experiment described below was conducted in a nitrogen-substituted glove box.

In a four-neck flask equipped with a stirrer and a temperature controller, was placed 100 parts of toluene, and the temperature was controlled to be at 30° C. Thereto, were charged 5 weight parts of a solution of a diethylaluminum chloride in hexane (catalyst concentration in hexane solution: 0.2 mmol/mL), 5 weight parts of a solution of a vanadium trichloride oxide in hexane (catalyst concentration in hexane solution: 0.02 mmol/mL), 50 parts of 5-ethylidene-2-norbornene, and 50 parts of 1-hexene. Polymerization was allowed to proceed at 30° C. for 120 minute to obtain a copolymer solution.

This copolymer solution was added dropwise into 3000 parts of isopropanol with stirring to form a precipitate. From the precipitate, the solvent was evaporated off at 100° C. under a reduced pressure of 10 mmHg to obtain 70 parts of a copolymer (H①).

(H①) had an Mw of 98,000, Mn of 25,000, and a double bond equivalent of 204 according NMR analysis. From the Mn and the double bond equivalent, the number of crosslinking functional groups (double bonds) of (H①) was estimated to be 114.

(H①) was dissolved in toluene to obtain a solution of a solid matter content of 40% to prepare a copolymer solution (H①S).

Synthesis Example 4

A curable resin (A③) was prepared by dry-blending 100 parts of the copolymer solution (H①S), 20 parts of glycidyl methacrylate, and 7.0 parts of 2,5-dimethyl-2,5-di(t-butylperoxy)hexane (trade name PERHEXA 25B, produced by Nihon Yushi K.K.) at room temperature, and extruding the dry-blended matter by a twin-screw extruder at a cylinder temperature of 260° C. and a screw revolution speed of 230 rpm.

(A③) had an Mw of 117,000, Mn of 29,000, and an epoxy equivalent of 850. From the Mn and the epoxy equivalent, the number of crosslinking functional groups of (A③) was estimated to be 138.

(A③) was dissolved in toluene to obtain a solution of a solid matter content of 40% to prepare a curable resin solution (A③S).

Synthesis Example 5

A curable resin (A④) was prepared by dry-blending 100 parts of a cyclic olefin resin (Mw 28,000) produced by ring-opening polymerization of 6-methyl-1,4:5,8-dimethano-1,4,4a,5,6,7,8,8a-octahydronaphthalene (MTD) in a conventional manner, 20 parts of glycidyl methacrylate, and 7.0 parts of 2,5-dimethyl-2,5-di(t-butylperoxy)hexane (trade name PERHEXA 25B, produced by Nihon Yushi K.K.) at room temperature, and extruding the dry-blended matter by a twin-screw extruder at a cylinder temperature of 260° C. and a screw revolution speed of 230 rpm.

(A④) had an Mw of 33,000, Mn of 8,400, and an epoxy equivalent of 840. From the Mn and the epoxy equivalent, the number of crosslinking functional groups (epoxy groups) of (A④) was estimated to be 10.

(A④) was dissolved in toluene to obtain a solution of a solid matter content of 40% to prepare a curable resin solution (A④S).

Synthesis example 6

Into a reaction vessel having been purged with nitrogen, was placed 50 parts of methylethyl ketone, and was heated to 80° C. In another vessel having been purged with nitrogen, were mixed and dissolved uniformly 200 parts of hydroxyethyl methacrylate, 200 parts of styrene, 200 parts of methyl ethyl ketone, and 1.5 parts of azobisisobutyronitrile. This mixture was added dropwise into the reaction vessel in 4 hours. After completion of the dropping addition, the mixture was allowed to age at 100° C. for 4 hours to obtain a solution of a hydroxyl group-containing resin in methyl ethyl ketone.

To 100 part of the solution of the hydroxyl group-containing resin in methyl ethyl ketone, was added 30 parts of acrylic acid, and esterification was allowed to proceed with supplemental addition of the solvent (methyl ethyl ketone) under a reduced pressure at 100° C. for 4 hours to obtain a solution of a curable resin (A⑤) in methyl ethyl ketone.

(A⑤) had an Mw of 160,000, an Mn of 45,000, and an acryloyl equivalent of 610 according to NMR analysis. From the Mn and the acryloyl equivalent, the number of crosslinking functional groups (acryloyl groups) of (A⑤) was estimated to be 74.

To (A⑤), methyl ethyl ketone was added for adjustment to obtain a solution of a solid matter content of 40% to prepare a curable resin solution (A⑤S).

Synthesis Example 7

Into a reaction vessel having been purged with nitrogen, was placed 50 parts of methyl ethyl ketone, and was heated to 80° C. In another vessel having been purged with nitrogen, were mixed and dissolved uniformly 120 parts of propenyloxyethyl methacrylate, 280 parts of styrene, 200 parts of methyl ethyl ketone, 170 parts of styrene/butadiene/styrene block copolymer (Y1①) (trade name TR2250, produced by JSR (styrene/butadiene weight ratio=52/48, Mw=90,000, carbon-carbon bond concentration $8.9 \times 10^{-3}$ mol/g)), and 1.5 parts of azobisisobutyronitrile. This mixture was added dropwise into the reaction vessel in 4 hours. After completion of the dropping addition, the mixture was allowed to age at 100° C. for 4 hours to obtain a solution of a curable resin material (③) comprising a styrene/propenyloxyethyl methacrylate copolymer (styrene/propenoxyethyl methacrylate weight ratio=70/30, curable resin (A⑥)) containing the styrene/butadiene/styrene block copolymer dispersed therein.

The curable resin material (③) had an Mw of 230,000, an Mn of 90,000, and an propenyl ether group equivalent of 570 according to NMR analysis. From the Mn and the propenyl ether group equivalent, the number of crosslinking functional groups (propenyl ether group) of (③) was estimated to be 158.

(③) was dissolved in methyl ethyl ketone to obtain a solution of a solid matter content of 40% to prepare a curable resin material solution (③S).

Synthesis Example 8

In a reaction vessel having been purged with nitrogen, were placed 100 parts of toluene, 100 parts of Epicoat 828 (bisphenol-A type epoxy resin, produced by Yuka Shell Epoxy K.K.), and 50 parts of dodecylamine. The mixture was allowed to react at 25° C. for 4 hours with stirring to obtain a thermoplastic resin (Y2①).

(Y2①) had an Mw of 75,000, an Mn of 37,000, and a nitrogen-carbon bond concentration of $1.9 \times 10^{-3}$ mol/g.

(Y2①) was dissolved in toluene to obtain a solution of a solid matter content of 40% to prepare a thermoplastic resin solution (Y2①S).

Synthesis Example 9

Into a reaction vessel having been purged with nitrogen, was placed 50 parts of methyl ethyl ketone, and was heated to 80° C. In another vessel having been purged with nitrogen, were mixed and dissolved uniformly 200 parts of glycidyl methacrylate, 200 parts of styrene, 200 parts of tridecafluorohexylethyl acrylate ($C_6F_{13}C_2H_4$—OCOCH=$CH_2$), 200 parts of methyl ethyl ketone, 170 parts of styrene/butadiene/styrene block copolymer (Y1①) (trade name TR2250, produced by JSR (styrene/butadiene weight ratio=52/48, Mw=90,000, carbon-carbon bond concentration $8.9 \times 10^{-3}$ mol/g)), and 1.5 parts of azobisisobutyronitrile. This mixture was added dropwise into the reaction vessel in 4 hours. After completion of the dropping addition, the mixture was allowed to age at 100° C. for 4 hours to obtain a curable resin material (④) comprising a styrene/glycidyl methacrylate/tridecafluorohexylethyl acrylate copolymer (monomer weight ratio=50/50/50, curable resin (A⑦) containing the styrene/butadiene/styrene block copolymer (Y1①) dispersed therein.

(A⑦) had an Mw of 120,000, a number-average molecular weight (hereinafter referred to as "Mn") of 60,000 according to GPC, and an epoxy equivalent of 325. From the Mn and the epoxy equivalent, the number of crosslinking functional groups (epoxy group) of (A⑦) was estimated to be 185.

(④) was dissolved in methyl ethyl ketone to obtain a solution of a solid matter content of 40% to prepare a curable resin material solution (A⑦S).

Example 1

Example of Combination of X1 and Y1

To 175 parts of the thermally curable resin material solution (①S), were added 30 parts of resorcinol diglycidyl ether (B①), and 6 parts of 2-ethyl-4-methylimidazole (C①) to obtain a solution of the curable resin material (④).

This solution was applied on a PET film (257 mm×364 mm) of 50 μm thick by means of a knife coater (Knife Coater SNC-300, manufactured by Yasui Seiki K.K.). The applied solution was dried at 60° C. for 30 minutes to remove the solvent to prepare a curable film (④F) on the PET film. The curable film (④F) had a thickness of 47±2 μm.

The curable film (④F) was brought into contact with a BT substrate (CCL-HL830, produced by Mitsubishi Gas Chemical Co., 100 mm×100 mm, a half of copper foil being removed from the front and back faces respectively), and hot-pressed under conditions of 120° C., 5 minutes, and 0.4 kgf/cm². Thereafter the PET film was peeled off, and the curable film was cured at 180° C. for 3 hours to obtain an insulator (④Z).

The insulator (④Z) was cut by a diamond cutter. The cross section was observed by a scanning electron microscope. Thereby the average particle diameter of the (Y1①) (styrene/butadiene block copolymer)) was calculated to be 0.4 μm.

This insulator (④Z) was subjected to a thermal cycle test with repetition of a thermal cycle pattern: constant temperature of −55° C. for 30 seconds, temperature elevation to 125° C. in 10 seconds, constant temperature of 125° C. for 30 seconds, temperature lowering to −55° C. in 10 seconds. Even after 1000 cycles, defect such as cracking, swelling, and peeling was not observed.

The cured surface of the insulator (④Z) was roughened and treated for copper plating in the same manner as described in Example of Examined Japanese Patent Publication 6-49852. The peeling strength (JIS C6481 (1995) 5.7) was found to be 0.8 kg/cm.

The curable film (④F) was cured at 170° C. for 90 minutes. The cured film had a dielectric constant of 2.9, a dielectric loss tangent of 0.009, and a volume resistivity of $5.1 \times 10^{16}$ Ω/cm at 1 GHz according to JIS K6911 (1995) 5.14. The tensile modulus (JIS K7113 (1995)) of ((④F) after curing was 16000 kgf/mm².

The thermal expansion coefficient (TMA tension loading method) of (④F) after curing was 45 ppm/° C.

The SP value of the styrene/butadiene/styrene block copolymer (Y1①) was 9.1, and the SP value of the curable resin composition (X1①) composed of the styrene/glycidyl methacrylate copolymer (curable resin (A①)) and resorcinol diglycidyl ether (B①) was 11.0. Therefore, the difference in the SP value between (Y1①) and (X1①) was 1.9.

Example 2

Example of Combination of X1 and Y1

A solution of a curable resin material (⑤), a curable film (⑤F), and an insulator (⑤Z) were obtained in the same manner as in Example 1 except that 175 parts of heat-curable resin material solution (②S) was used in place of 175 parts of the heat-curable resin material solution (①S). The thickness of the curable film (⑤F) was 47±2 μm.

The average particle diameter of the particles of (Y1①) (styrene/butadiene/styrene block copolymer)) of the insulator (⑤Z) was 0.4 μm as calculated in the same manner as in Example 1.

The thermal cycle test was conducted in the same manner as in Example 1. As the results, even after 1000 cycles, defect of cracking, swelling, or peeling was not observed.

The peeling strength was measured in the same manner as in Example 1, and was found to be 0.8 kg/cm.

As the results of measurements in the same manner as in Example 1, the film (⑤F) after curing had a dielectric constant of 2.9, a dielectric loss tangent of 0.009, a volume resistivity of $3.5 \times 10^{16}$ Ω/cm, and a tensile modulus of 17400 kgf/mm².

The thermal expansion coefficient of (⑤F) after curing was 46 ppm/° C.

The difference in the SP value between (Y1①) and (X1①) was 1.9 similarly as in Example 1.

Example 3

Example of Combination of X2 and Y1

To 175 parts of a copolymer solution (H① S), were added 30 parts of ethylene glycol diallyl ether (I①), 2 parts of p-menthane hydroperoxide (C②), and 15 parts of a styrene/butadiene/styrene block copolymer (Y1①) (TR2250, produced by JSR). The mixture was stirred to obtain a solution of a curable resin material (⑥).

With this solution of the curable resin material (⑥), a curable film (⑥ F) was prepared in the same manner as in Example 1. With this film, an insulator (⑥ Z) was prepared in the same manner as in Example 1. The thickness of the curable film (⑥ F) was 47±2 μm.

The average particle diameter of the particles of (Y1①) (styrene/butadiene/styrene block copolymer)) of the insulator (⑥ Z) was 0.3 μm as calculated in the same manner as in Example 1.

The thermal cycle test was conducted with this insulator (Z⑥) in the same manner as in Example 1. As the results, defect of cracking, swelling, or peeling was not observed.

The peeling strength was measured in the same manner as in Example 1, and was found to be 0.8 kg/cm.

As the results of measurements in the same manner as in Example 1, the film (⑥ F) after curing had a dielectric constant of 2.4, a dielectric loss tangent of 0.006, a volume resistivity of $4.1 \times 10^{17}$ Ω/cm, and a tensile modulus of 18400 kgf/mm², and a thermal expansion coefficient of 47 ppm/°C.

The SP value of the styrene/butadiene/styrene block copolymer (Y1①) was 9.1, and the SP value of the curable resin composition (X2①) composed of copolymer solution (H ① S) and ethylene glycol diallyl ether (I①) was 9.9. Therefore, the difference in the SP value between (Y1①) and (X2①) was 0.8.

Example 4

Example of Combination of X1 and Y2

To 175 parts of a curable resin solution (A③ S), were added 30 parts of resorcinol diglycidyl ether (B①), 6 parts of 2-ethyl-4-methylimidazole (C5①), and 15 parts of a thermoplastic resin solution (Y2① S), and the mixture was stirred to obtain a solution of a curable resin material (⑦).

With this solution of the curable resin material (⑦), a curable film (⑦ F) was prepared in the same manner as in Example 1. With this film, an insulator (⑦ Z) was prepared in the same manner as in Example 1. The thickness of the curable film (⑦ F) was 47±2 μm.

The average particle diameter of the particles of (Y2①) of the insulator (⑦ Z) was 0.8 μm as calculated in the same manner as in Example 1.

This insulator (⑦ Z) was subjected to the thermal cycle test in the same manner as in Example 1. As the results, defect of cracking, swelling, or peeling was not observed.

The peeling strength was measured in the same manner as in Example 1, and was found to be 0.8 kg/cm.

As the results of measurements in the same manner as in Example 1, the film (⑦ F) after curing had a dielectric constant of 2.5, a dielectric loss tangent of 0.006, a volume resistivity of $4.3 \times 10^{17}$ Ω/cm, a tensile modulus of 18800 kgf/mm², and a thermal expansion coefficient of 47 ppm/°C.

The SP value of the curable resin (Y2①) was 13.5, and the SP value of the curable resin composition (X1②) composed of curable resin (A③) and resorcinol diglycidyl ether (B①) was 11.2. Therefore, the difference in the SP value between (Y2①) and (X1②) was 2.3.

Example 5

Example of Combination of X1 and Y2

A solution of a curable resin material (⑧) was obtained in the same manner as in Example 4 except that 175 parts of a curable resin material solution (A④ S) was used in place of 175 parts of the curable resin material solution (A ③ S).

With this solution of the curable resin material (⑧), a curable film (⑧ F) was prepared in the same manner as in Example 1. With this film, an insulator (⑧ Z) was prepared in the same manner as in Example 1. The thickness of the curable film (⑧ F) was 47±2 μm.

The average particle diameter of the particles of (Y2①) of the insulator (⑧ Z) was 0.8 μm as calculated in the same manner as in Example 1.

This insulator (⑧ Z) was subjected to the thermal cycle test in the same manner as in Example 1. As the results, defect of cracking, swelling, or peeling was not observed.

The peeling strength was measured in the same manner as in Example 1, and was found to be 0.8 kg/cm.

As the results of measurements in the same manner as in Example 1, the film (⑨ F) after curing had a dielectric constant of 2.5, a dielectric loss tangent of 0.006, a volume resistivity of $2.9 \times 10^{17}$ Ω/cm, a tensile modulus of 16800 kgf/mm², and a thermal expansion coefficient of 46 ppm/°C.

The SP value of the curable resin (Y2①) was 13.5, and the SP value of the curable resin composition (X10) composed of curable resin (A④) and resorcinol diglycidyl ether (B①) was 10.2. Therefore, the difference in the SP value between (Y2①) and (X1③) was 3.5.

Example 6

Example of Combination of X1 and Y2

To 175 parts of a curable resin solution (A⑤ S), were added 30 parts of ethylene glycol dimethacrylate (B②), 2 parts of p-menthane hydroperoxide (C②), and 15 parts of a thermoplastic resin solution (Y2① S). The mixture was stirred to obtain a solution of a curable resin material (⑨).

With this solution of the curable resin material (⑨), a curable film (⑨ F) was prepared in the same manner as in Example 1. With this film, an insulator (⑨ Z) was prepared in the same manner as in Example 1. The thickness of the curable film (⑨ F) was 47±2 μm.

The average particle diameter of the particles of (Y2①) of the insulator (⑨ Z) was 0.5 μm as calculated in the same manner as in Example 1.

This insulator (⑨ Z) was subjected to the thermal cycle test in the same manner as in Example 1. As the results, defect of cracking, swelling, or peeling was not observed.

The peeling strength was measured in the same manner as in Example 1, and was found to be 0.8 kg/cm.

As the results of measurements in the same manner as in Example 1, the film (⑨ F) after curing had a dielectric constant of 2.9, a dielectric loss tangent of 0.009, a volume resistivity of $4.6 \times 10^{16}$ Ω/cm, and a tensile modulus of 18200 kgf/mm², and a thermal expansion coefficient of 47 ppm.

The SP value of the curable resin (Y2①) was 13.5, and the SP value of the curable resin composition (X1④)

comprising curable resin (A⑤) and ethylene glycol dimethacrylate (B②) was 10.4. Therefore, the difference in the SP value between (Y2①) and (X1④) was 3.1.

Example 7

Example of Combination of X1 and Y1

A solution of a curable resin material (⑩) was prepared by stirring 175 parts of a curable resin material solution (③S) and 5.0 parts by weight of a photo-induced cation polymerization initiator (UVR-6990, produced by Union Carbide Co.).

A curable film (⑩F) was prepared by using the solution of a curable resin material (⑩) in the same manner as in Example 1.

The curable film (⑩F) was irradiated with ultraviolet light (with a high-pressure mercury-vapor lamp of 80 W/cm, at a distance of 10 cm, irradiation intensity of 160 mW/cm$^2$) at 150° C. for one minute, and was further heat-treated at 150° C. for 3 hours to obtain an insulator (⑩Z). The thickness of the curable film (⑩) was 47±2 µm.

The average particle diameter of (Y1①) in the insulator (⑩Z) was 0.4 µm by calculation in the same manner as in Example 1.

This insulator (⑩Z) was subjected to the thermal cycle test in the same manner as in Example 1. As the results, defect of cracking, swelling, or peeling was not observed. The peeling strength was measured in the same manner as in Example 1, and was found to be 0.8 kg/cm.

As the results of measurements in the same manner as in Example 1, the film (⑩F) after curing had a dielectric constant of 2.9, a dielectric loss tangent of 0.009, a volume resistivity of 6.7×10$^{16}$ Ω/cm, and a tensile modulus of 22000 kgf/mm$^2$, and a thermal expansion coefficient of 45 ppm.

The film (⑩F) had a dielectric constant of 2.9 after curing by irradiation of ultraviolet light (with a high-pressure mercury-vapor lamp of 80 W/cm, at a distance of 10 cm, irradiation intensity of 160 mW/cm$^2$) at 150° C. for one minute and further heat-treatment at 150° C. for 3 hours. The SP value of the curable resin (Y1①) was 9.1, and the SP value of the curable resin composition (X1⑤) comprising the curable resin (A⑥) was 10.2.

Therefore, the difference in the SP value between (Y1①) and (X1⑤) was 1.1.

Example 8

Example of Combination of X3 and Y1

To 175 parts of a curable resin material solution (⑦S), were added 30 parts of resorcinol diglycidyl ether (B①), and 6 parts of 2-ethyl-4-methylimidazole (C①) and the mixture was stirred to obtain a solution of a curable resin material (⑪).

This solution was applied on a PET film (257 mm×364 mm) of 50 µm thick by means of a knife coater (Knife Coater SNC-300, manufactured by Yasui Seiki K.K.). The applied solution was dried at 60° C. for 30 minutes to remove the solvent to prepare a curable film (⑪F) on the PET film. The curable film (⑪F) had a thickness of 47±2 µm.

The curable film (⑪F) was brought into contact with a BT substrate (CCL-HL830, produced by Mitsubishi Gas Chemical Co., 100 mm×100 mm, a half of copper foil being removed from the front and back faces respectively), and hot-pressed under conditions of 120° C., 5 minutes, and 0.4 kg/cm$^2$. Thereafter the PET film was peeled off, and the curable film was cured at 180° C. for 3 hours to obtain an insulator (⑪Z). The average particle diameter of (Y1①) in the insulator (⑪Z) was 0.5 µm by calculation in the same manner as in Example 1.

This insulator (⑪Z) was subjected to the thermal cycle test in the same manner as in Example 1. As the results, defect of cracking, swelling, or peeling was not observed. The peeling strength was measured in the same manner as in Example 1, and was found to be 0.8 kg/cm.

As the results of measurements in the same manner as in Example 1, the film (⑪F) after curing had a dielectric constant of 2.7, a dielectric loss tangent of 0.007, a volume resistivity of 5.7×10$^{16}$ Ω/cm, and a tensile modulus of 19000 kgf/mm$^2$, and a thermal expansion coefficient of 43 ppm.

The SP value of the curable resin (Y1①) was 9.1, and the SP value of the curable resin composition (X1⑤) comprising the curable resin (A⑦) was 9.7.

Therefore, the difference in the SP value between (Y1①) and (X1⑤) was 0.6.

Comparative Example 1

To 100 parts of EPICOAT 828 (trade name, bisphenol-A type epoxy resin, produced by Yuka Shell Epoxy K.K.), was added 85 parts of 4-methylcyclohexane-1,2-dicarboxylic acid, and the mixture was stirred. This mixture was applied on a BT substrate (CCL-HL830, produced by Mitsubishi Gas Chemical Co., 100 mm×100 mm, a half of copper foil being removed from the front and back faces respectively) by means of a knife coater (Knife Coater SNC-300, manufactured by Yasui Seiki K.K.) in a layer thickness of 62±2 µm. The applied matter was cured at 180° C. for 3 hours to prepare a comparative insulator (1).

This comparative insulator (1) was subjected to the thermal cycle test in the same manner as in Example 1. As the results, after 500 cycles, cracking was observed at a ratio of one crack per cm$^2$.

The peeling strength after roughening and copper plating was measured in the same manner as in Example 1, and was found to be 0.2 kg/cm.

As the results of measurements in the same manner as in Example 1, the comparative insulator (1) had a dielectric constant of 3.6, a dielectric loss tangent of 0.020, a volume resistivity of 4.8×10$^{16}$ Ω/cm, and a tensile modulus of 38000 kgf/mm$^2$, and a thermal expansion coefficient of 60 ppm.

Comparative Example 2

To 100 parts of cresol novolak epoxy resin, was added 95 parts of 4-methylcyclohexane-1,2-dicarboxylic acid, and the mixture was stirred. This mixture was applied on a BT substrate (CCL-HL830, produced by Mitsubishi Gas Chemical Co., 100 mm×1.00 mm, a half of copper foil being removed from the front and back faces respectively) by means of a knife coater (Knife Coater SNC-300, manufactured by Yasui Seiki K.K.) in a layer thickness of 62±2 µm. The applied matter was cured at 180° C. for 3 hours to prepare a comparative insulator (2).

This comparative insulator (2) was subjected to the thermal cycle test in the same manner as in Example 1. As the results, after 700 cycles, cracking was observed at a ratio of one crack per cm. The peeling strength after roughening and copper plating was measured in the same manner as in Example 1, and was found to be 0.2 kg/cm.

As the results of measurements in the same manner as in Example 1, the comparative insulator (2) had a dielectric constant of 3.5, a dielectric loss tangent of 0.020, a volume resistivity of $5.3 \times 10^{16}$ Ω/cm, and a tensile modulus of 35000 kgf/mm$^2$, and a thermal expansion coefficient of 70 ppm/° C.

INDUSTRIAL APPLICABILITY

The curable resin, the curable resin material, and the curable film of the present invention are suitable for production of an insulator having excellent thermal shock resistance and excellent dielectric properties.

Further, use of the curable resin, curable resin material, or curable film of the present invention enables formation of an insulator having excellent adhesiveness, thermal resistance, solvent resistance, low water absorbency, electrical insulation performance, chemical resistance, workability, and the like properties.

Accordingly, the present invention is suitable for production of overcoating materials or layer insulation materials for circuit boards of electrical equipment, electronic parts, or semiconductor elements.

The curable resin, the curable resin material, and the curable film of the present invention are useful in various application fields, being not limited to the technical fields of the circuit boards and the like. In particular, the material of the present invention is excellent in formation of thin films.

The invention claimed is:

1. A curable resin material comprising:
a curable resin composition (X), and
a thermoplastic resin (Y);
wherein the difference between solubility parameters of resins (X) and (Y) is 0.5 to 3.0, and
the thermoplastic resin (Y) has a weight-average molecular weight of 60,000 to 100,000;
said curable resin composition (X) consisting of one of two curable resin compositions (X1) or (X3), wherein:
(X1) is the combination of a curable resin (A) and a compound (B) having a molecular weight of 170 to 3,000 and a crosslinking functional group, wherein curable resin (A) has, in its molecule, at least two crosslinking functional groups of at least one group selected from the group consisting of an epoxy group, a (meth)acryloyl group, an alkenylamino group and an alkenyloxy group and has a glass transition temperature before curing of 50 to 150° C., and a weight-average molecular weight of 10,000 to 1,000,000; and wherein curable resin (B) has, in its molecule, at least two crosslinking functional groups of at least one group selected from the group consisting of an epoxy group, a (meth)acryloyl group, an alkenylamino group and an alkenyloxy group; and
(X3) is the combination of:
a copolymer (J), which has a Mw of 2,000 to 1,000,000, formed from the monomers selected from the group consisting of monomers (f) having an epoxy group and a (meth)acryloyl group, monomers (g) having an epoxy group and a vinyl group, monomers (h) having a (meth)acryloyl group and a vinyloxy group, monomers (i) having a (meth)acryloyl group and an allyloxy group, monomers (j) having a (meth)acryloyl group and an propenyloxy group, monomers (v) having an allylamino group and monomers (w) having a propenylamino group, wherein at least one of monomers (f, g and w) is selected for the copolymer; and a monomer (3), (4) or (5) having formula 3, 4 or 5, respectively, as follows:

$$CF_2=CF-O-C_nF_{2n+1} \tag{3}$$

wherein n is an integer of 1 to 10;

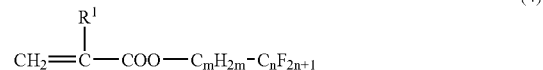

$$CH_2=\overset{R^1}{\underset{|}{C}}-COO-C_mH_{2m}-C_nF_{2n+1} \tag{4}$$

wherein R$^1$ is hydrogen or methyl, m is an integer of 0 to 6, and n is an integer of 1 to 10;

$$F-\overset{R^3}{\underset{|}{C}}=\overset{R^4}{\underset{|}{C}}-R^5 \tag{5}$$

wherein R$^3$ is hydrogen or fluorine, R$^4$ is hydrogen, chlorine, or fluorine, and R$^5$ is hydrogen, fluorine, or trifluoromethyl.

2. A curable resin material comprising:
a curable resin composition (X), and
a thermoplastic resin (Y) which has a weight-average molecular weight ranging from 60,000 to 100,000;
wherein the difference between solubility parameters of resins (X) and (Y) is 1.0 to 3.0, and (X) has a solubility parameter of 5.0 to 12.0,
wherein said curable resin composition (X) consists of
a curable resin (A), which has in its molecule, at least two crosslinking functional groups of at least one group selected from the group consisting of an epoxy group, a (meth)acryloyl group, an alkenylamino group and an alkenyloxy group and has a glass transition temperature before curing of 50 to 150° C., and a weight-average molecular weight of 10,000 to 1,000,000, and/or a curable resin (B), which has in its molecule, at least two crosslinking functional groups of at least one group selected from the group consisting of an epoxy group, a (meth)acryloyl group, an alkenylamino group and an alkenyloxy group.

3. A substrate to which the curable resin material of claim 1 has been applied, and optionally cured.

4. The substrate of claim 3 in which the curable or cured resin material is in the form of an overcoat material or an interlayer insulating material on an electronic element, hybrid IC, MCM, electric wiring board or display part.

5. A method for insulating a substrate comprising:
applying the curable resin material of claim 1 to a substrate, and
curing said curable resin material.

6. A substrate to which the curable resin material of claim 2 has been applied, and optionally cured.

7. The substrate of claim 6 in which the curable or cured resin material is in the form of an overcoat material or an interlayer insulating material on an electronic element, hybrid IC, MCM, electric wiring board or display part.

8. A method for insulating a substrate comprising:
applying the curable resin material of claim 2 to a substrate, and
curing said curable resin material.

9. The curable resin material of claim 1, wherein said curable resin composition (X) is (X1).

10. The curable resin material of claim 1, wherein said curable resin composition (X) is (X3).

* * * * *